US010085334B2

(12) United States Patent
Yabu

(10) Patent No.: US 10,085,334 B2
(45) Date of Patent: Sep. 25, 2018

(54) EXTREME ULTRAVIOLET LIGHT GENERATING SYSTEM

(71) Applicant: Gigaphoton Inc., Tochigi (JP)

(72) Inventor: Takayuki Yabu, Oyama (JP)

(73) Assignee: Gigaphoton Inc., Tochigi (JP)

( * ) Notice: Subject to any disclaimer, the term of this patent is extended or adjusted under 35 U.S.C. 154(b) by 0 days.

(21) Appl. No.: 15/912,628

(22) Filed: Mar. 6, 2018

(65) Prior Publication Data

US 2018/0199422 A1    Jul. 12, 2018

Related U.S. Application Data

(63) Continuation of application No. PCT/JP2015/078110, filed on Oct. 2, 2015.

(51) Int. Cl.
*G03F 7/20* (2006.01)
*G01J 1/04* (2006.01)
*G01J 1/20* (2006.01)
*H05G 2/00* (2006.01)

(52) U.S. Cl.
CPC ......... *H05G 2/008* (2013.01); *G03F 7/70033* (2013.01); *H05G 2/006* (2013.01)

(58) Field of Classification Search
USPC .... 250/201.4, 492.1, 493.1, 504 R, 548, 526
See application file for complete search history.

(56) References Cited

U.S. PATENT DOCUMENTS

| 8,525,140 B2 | 9/2013 | Abe et al. |
| 8,569,722 B2 | 10/2013 | Kakizaki et al. |
| 8,653,437 B2 * | 2/2014 | Partlo ................. G03F 7/70033 250/205 |
| 8,698,113 B2 * | 4/2014 | Moriya ............... G03F 7/70008 250/503.1 |

(Continued)

FOREIGN PATENT DOCUMENTS

| JP | 2000-311845 A | 11/2000 |
| JP | 2011-210704 A | 10/2011 |

(Continued)

OTHER PUBLICATIONS

Written Opinion of the International Searching Authority issued in PCT/JP2015/078110; dated Dec. 28, 2015.

*Primary Examiner* — Bernard Souw
(74) *Attorney, Agent, or Firm* — Studebaker & Brackett PC

(57) ABSTRACT

An extreme ultraviolet light generating system repetitively outputs extreme ultraviolet light emitted by a target that turns into plasma by being irradiated with a pulsed laser beam. The extreme ultraviolet light generating system may include: a target supply unit that sequentially supplies the target to a plasma generating region set within a chamber, an actuator connected to a laser beam focusing system that focuses the pulsed laser beam output from a laser apparatus that adjusts the focusing position of the pulsed laser beam, an extreme ultraviolet light generation controller that controls the extreme ultraviolet light generating system to (Continued)

output extreme ultraviolet light based on a burst pattern, and an actuator controller that controls the actuator to compensate for shifts of the focusing position of the pulsed laser beam during a burst operation by feedforward control.

20 Claims, 12 Drawing Sheets

(56) References Cited

U.S. PATENT DOCUMENTS

| | | | |
|---|---|---|---|
| 8,847,181 B2* | 9/2014 | Moriya | H05G 2/003 |
| | | | 250/504 R |
| 8,957,356 B2 | 2/2015 | Moriya et al. | |
| 9,318,864 B2* | 4/2016 | Nowak | H01S 3/2316 |
| 9,444,214 B2 | 9/2016 | Dinger | |
| 2011/0220816 A1* | 9/2011 | Kakizaki | H05G 2/003 |
| | | | 250/504 R |
| 2012/0228525 A1* | 9/2012 | Moriya | H05G 2/003 |
| | | | 250/504 R |
| 2013/0032735 A1* | 2/2013 | Nowak | H01S 3/0085 |
| | | | 250/504 R |
| 2013/0043401 A1 | 2/2013 | Graham et al. | |
| 2013/0048886 A1* | 2/2013 | Moriya | G03F 7/70008 |
| | | | 250/504 R |
| 2013/0051412 A1* | 2/2013 | Miyao | G03F 7/70025 |
| | | | 372/31 |

FOREIGN PATENT DOCUMENTS

| | | |
|---|---|---|
| JP | 2013-030546 A | 2/2013 |
| JP | 2013-105725 A | 5/2013 |
| JP | 2014-531743 A | 11/2014 |
| JP | 2015-506565 A | 3/2015 |

* cited by examiner

FIG.4
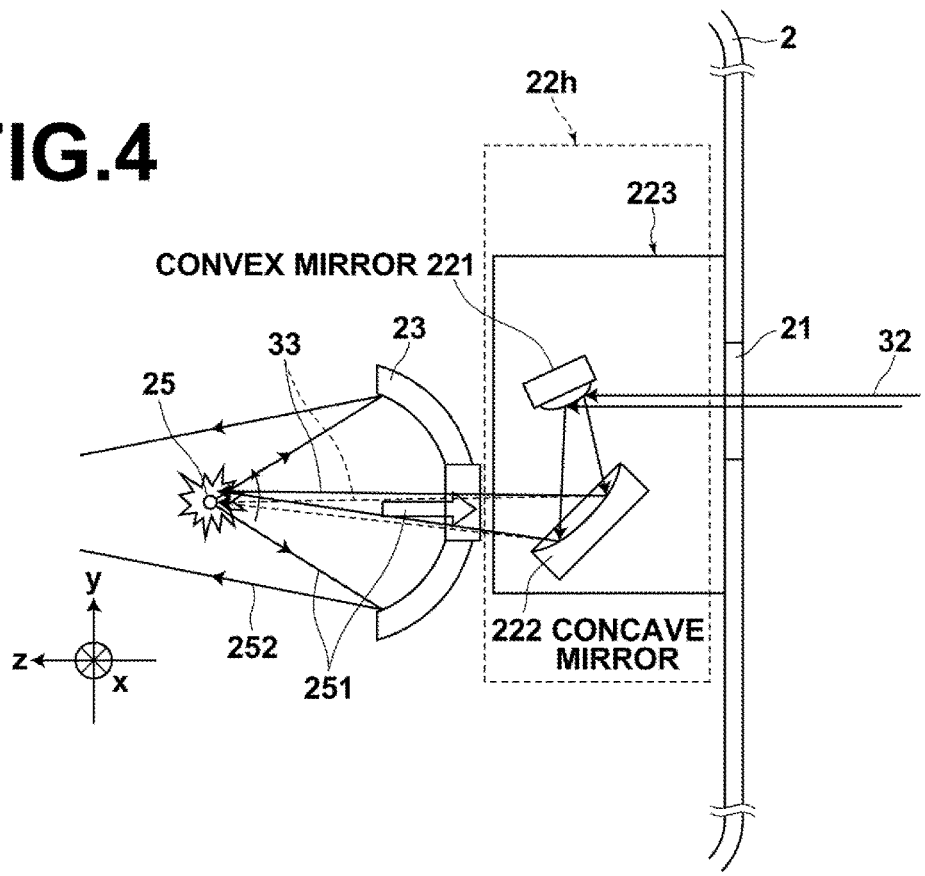
FIG.5
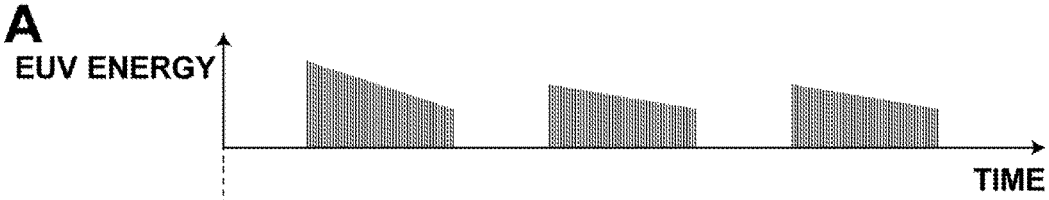
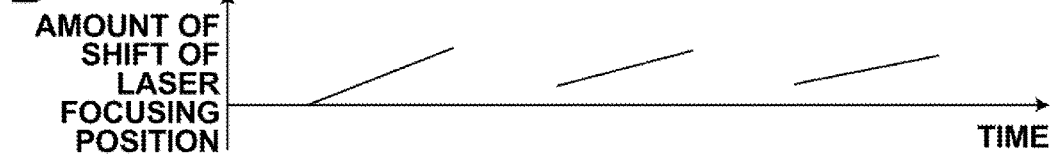

FIG.12
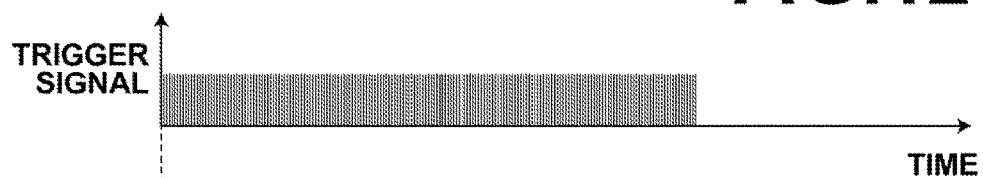
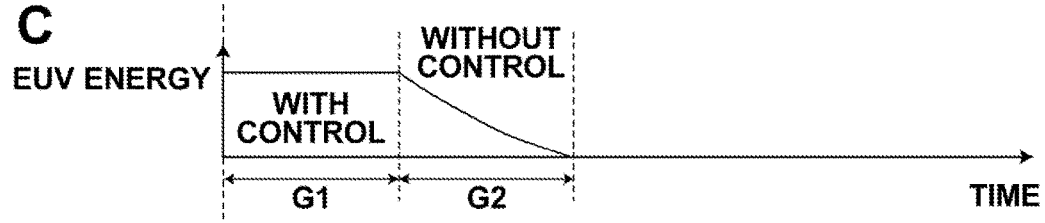
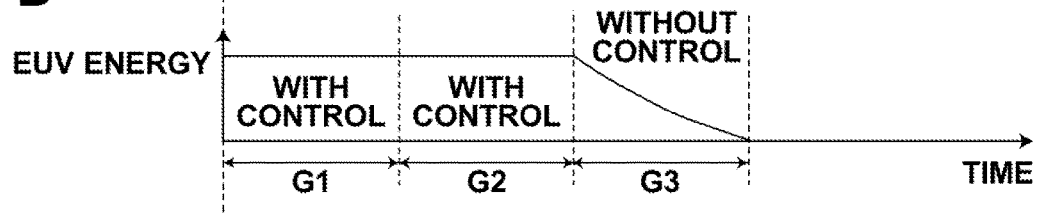
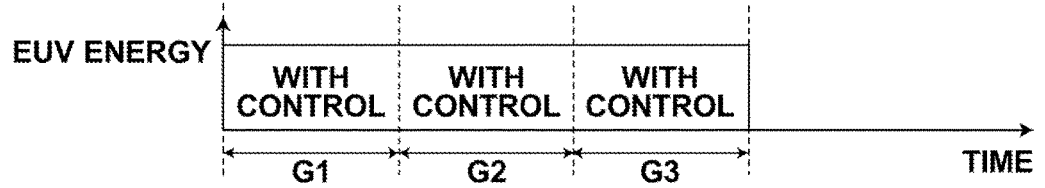

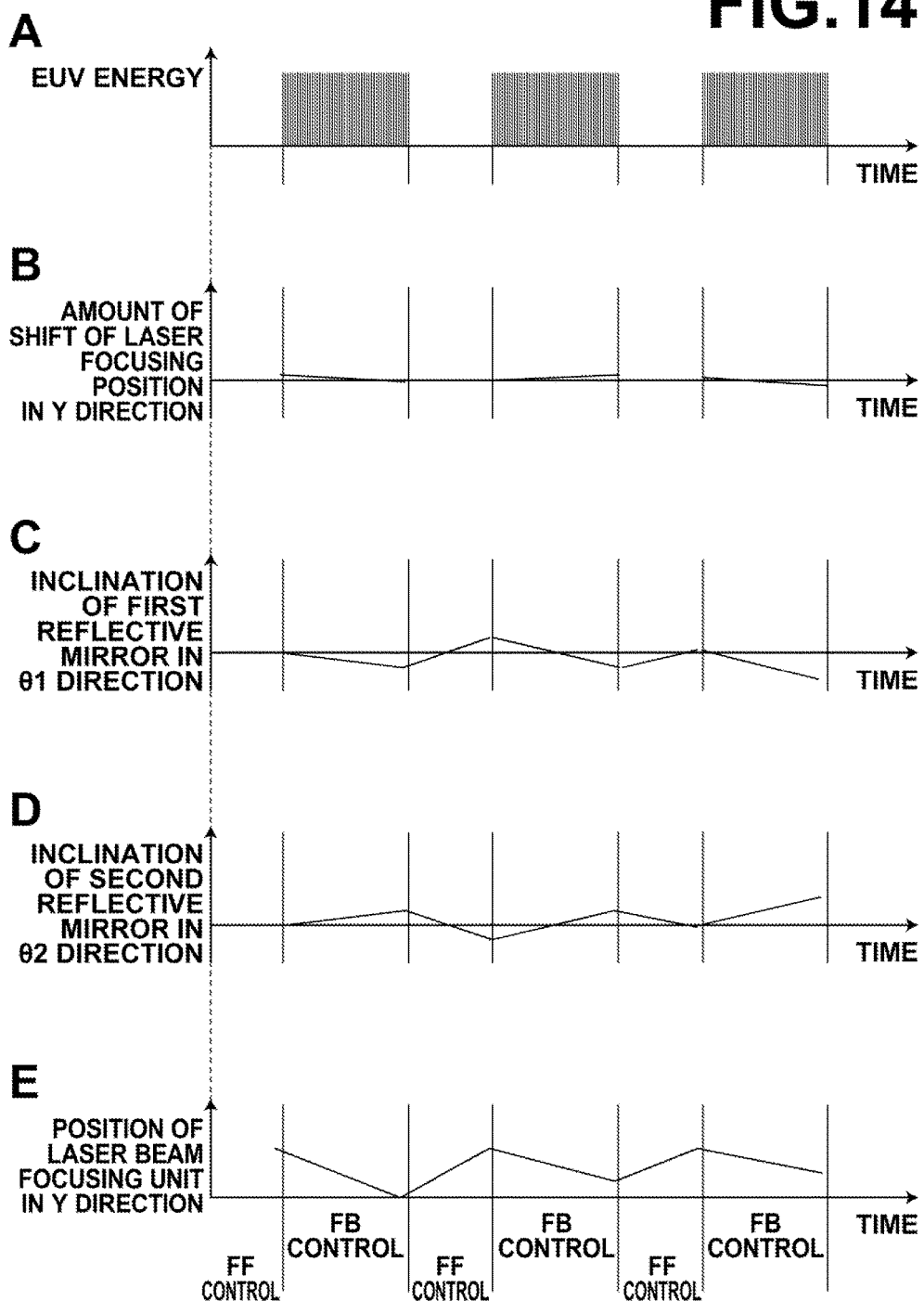

EXTREME ULTRAVIOLET LIGHT GENERATING SYSTEM

CROSS REFERENCE TO RELATED APPLICATIONS

The present application is a Continuation application of International Application No. PCT/JP2015/078110 filed on Oct. 2, 2015. The content of the application is incorporated herein by reference in its entirety.

BACKGROUND

1. Technical Field

The present disclosure is related to an extreme ultraviolet light generating system.

2. Related Art

Recently, as semiconductor processes have become finer, transfer patterns for use in photolithography of semiconductor processes have also become finer. In the next generation, microfabrication at 70 nm to 45 nm, and further, microfabrication at 20 nm or less will be in demand. In order to meet this demand, there is expectation for development of an exposure apparatus in which an extreme ultraviolet (EUV) light generating apparatus that generates extreme ultraviolet (EUV) light having a wavelength of approximately 13 nm is combined with a reduced projection reflective optic system. Three types of EUV light generating apparatuses have been proposed. The three types are: an LPP (Laser Produced Plasma) type apparatus that employs plasma which is generated by a target substance being irradiated with a laser beam; a DPP (Discharge Produced Plasma) type apparatus that employs plasma which is generated by electrical discharge, and an SR (Synchrotron Radiation) type apparatus that employs synchrotron orbital radiation.

RELATED ART DOCUMENTS

Patent Documents

[Patent Document 1]
Japanese Unexamined Patent Publication No. 2000-311845
[Patent Document 2]
PCT Japanese Publication No. 2014-531743
[Patent Document 3]
Japanese Unexamined Patent Publication No. 2011-210704

SUMMARY

An extreme ultraviolet light generating system according to one aspect of the present disclosure is an extreme ultraviolet light generating system that repetitively outputs extreme ultraviolet light which is generated by a target turning into plasma by being irradiated with a pulsed laser beam, and may include:
a chamber;
a target supply unit configured to sequentially supply the target into a plasma generating region which is set within the chamber;
a laser apparatus configured to output a pulsed laser beam;
a laser beam focusing system configured to focus the pulsed laser beam which is output from the laser apparatus;
an actuator connected to the laser beam focusing system, configured to adjust the focusing position of the pulsed laser beam;
an extreme ultraviolet light generation controller configured to control the extreme ultraviolet light generating system to output extreme ultraviolet light based on a burst pattern; and
an actuator controller configured to control the actuator by feedforward control to compensate for shifts of the focusing position of the pulsed laser beam with respect to the target which is supplied to the plasma generating region that occur during output of extreme ultraviolet light based on the burst pattern.

BRIEF DESCRIPTION OF THE DRAWINGS

Embodiments of the present disclosure will be described below as examples, with reference to the attached drawings.

FIG. 4 is a partial magnified diagram of a configuration for focusing a pulsed laser beam of the extreme ultraviolet generating system of the comparative example.

A and B of FIG. 5 are diagrams that illustrate the relationship between shifts of the focusing position of pulsed laser beams which are generated during burst operations and the energy of EUV light in the comparative example.

Figure 6:
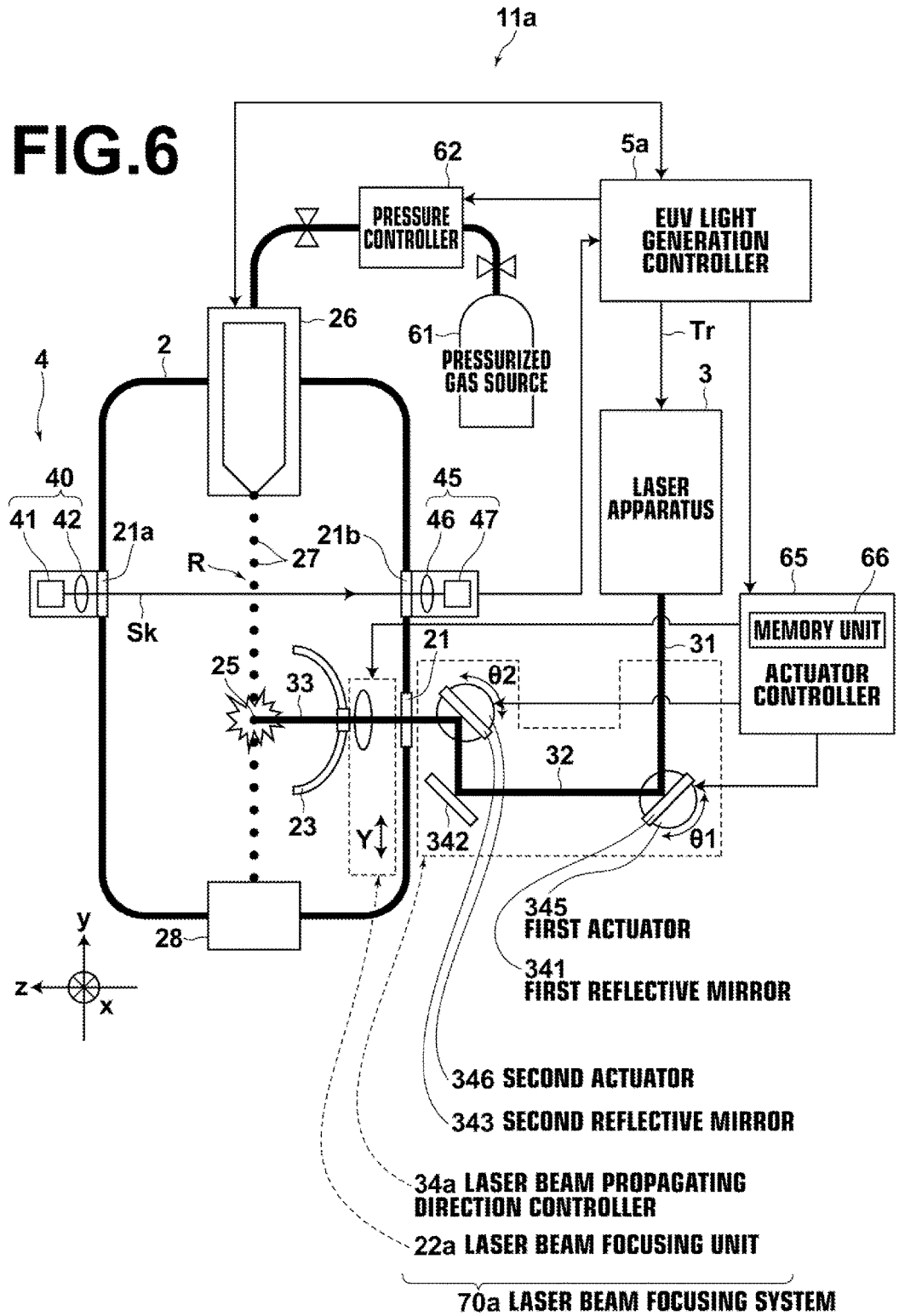

FIG. 6 is a partial cross sectional diagram that illustrates the schematic configuration of an extreme ultraviolet light generating system according to a first embodiment.

Figure 7:
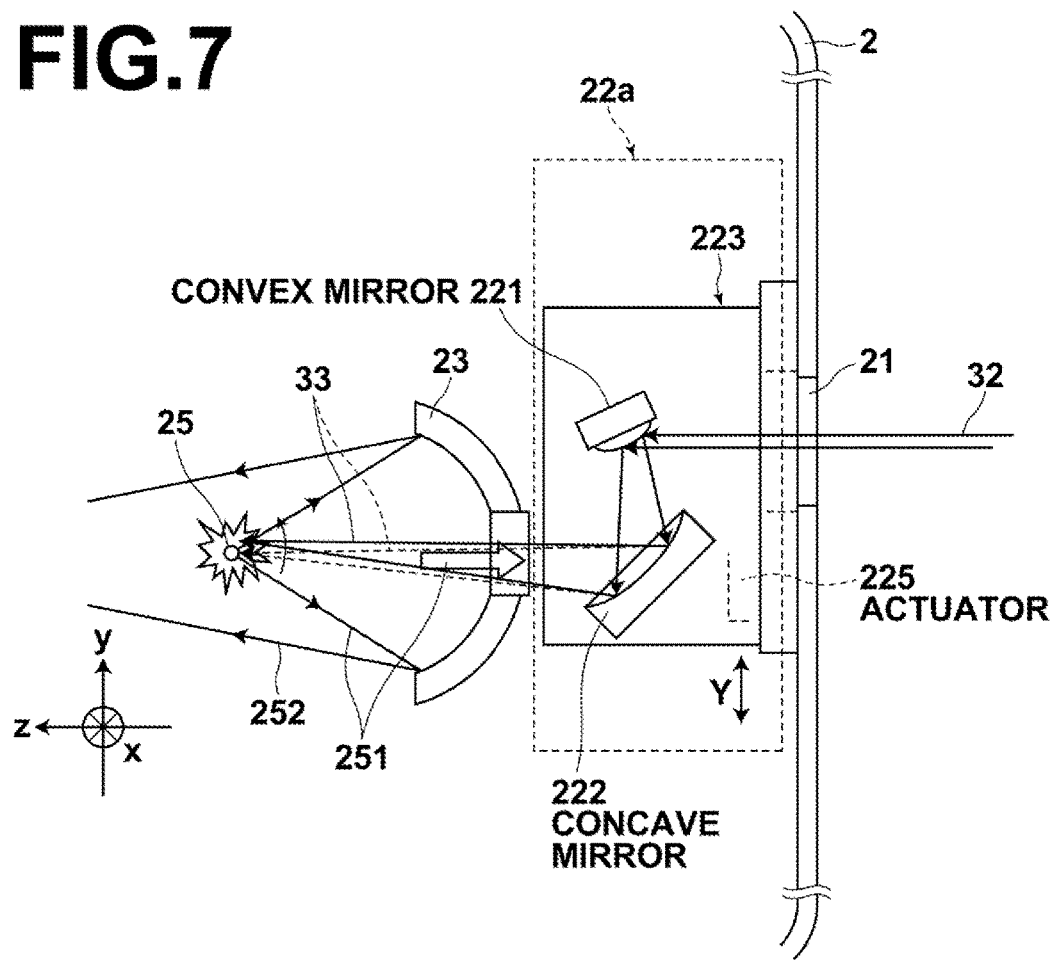

FIG. 7 is a magnified diagram that illustrates a portion of a configuration that focuses a pulsed laser beam in the extreme ultraviolet light generating system of the first embodiment.

Figure 8:
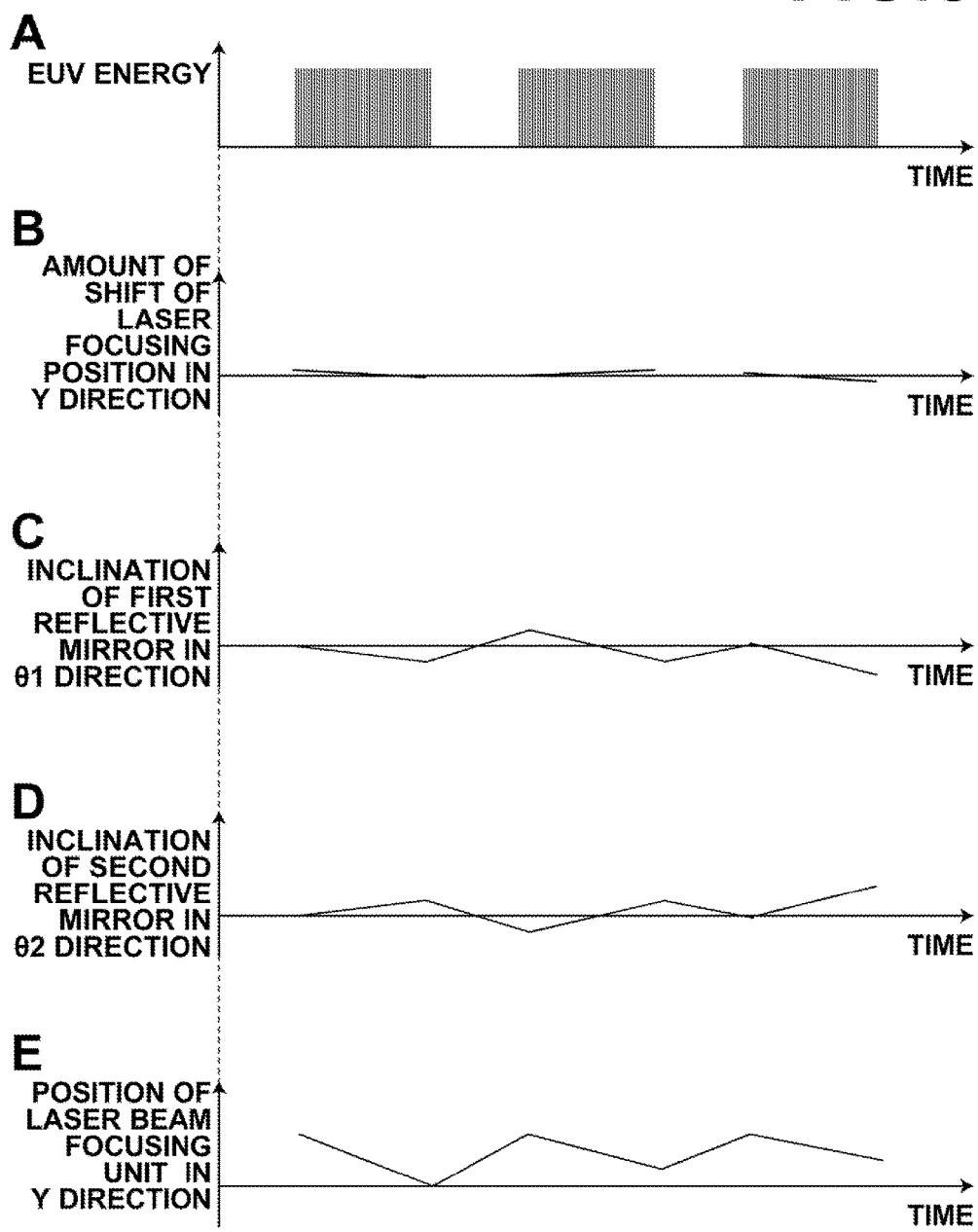

A through E of FIG. 8 are diagrams that illustrate the relationships among the energy of EUV light, an amount of shift of a laser focusing position in the Y direction, and the amount of control exerted by each actuator during a burst operation in the first embodiment.

Figure 9:
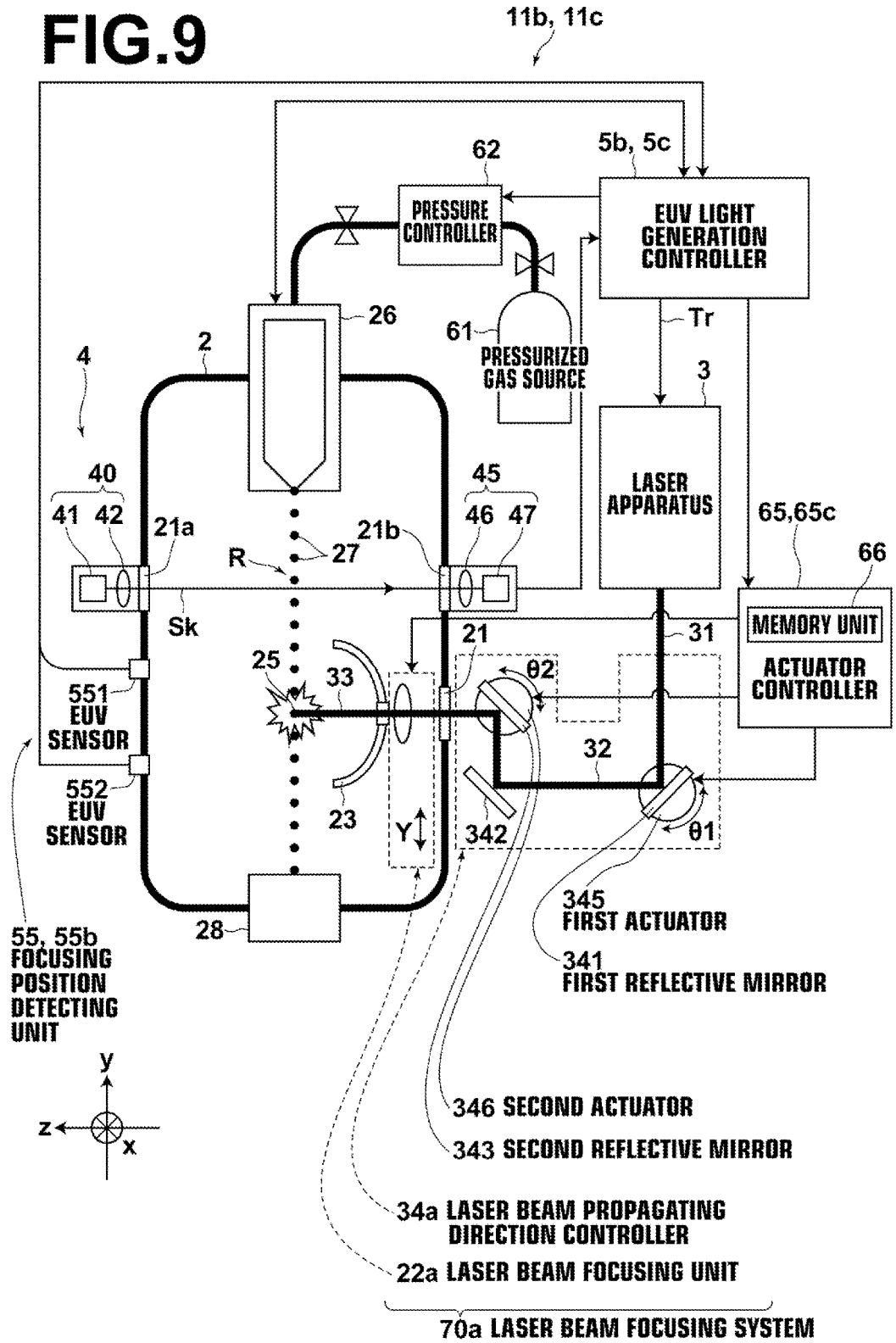

FIG. 9 is a partial cross sectional diagram that illustrates the schematic configuration of extreme ultraviolet light generating systems according to a second and a third embodiment.

Figure 10:
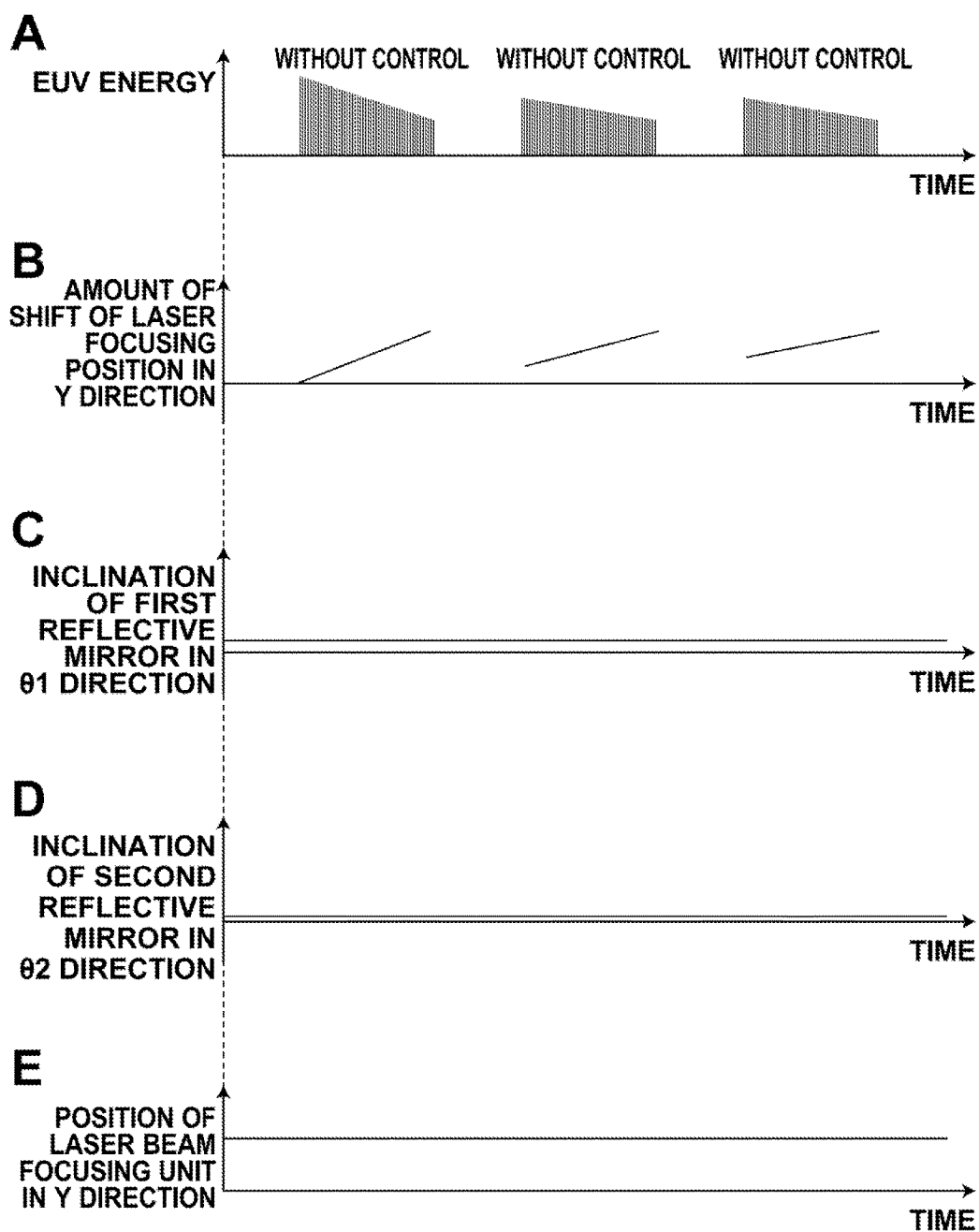

A through E of FIG. 10 are diagrams that illustrate the relationships among the energy of EUV light, an amount of shift of a laser focusing position in the Y direction, and the amount of control exerted by each actuator during a burst operation in the second embodiment.

Figure 11:
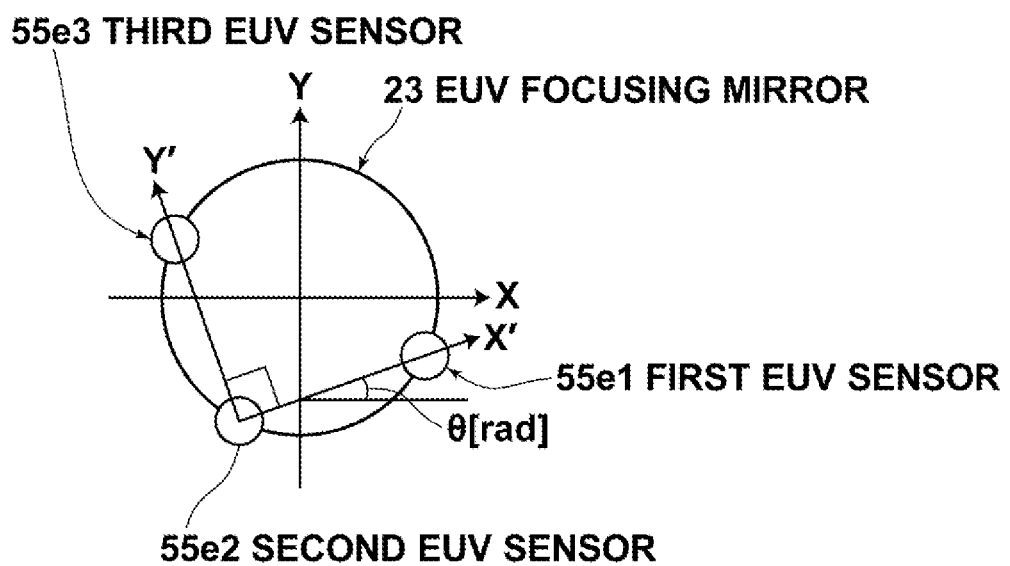

FIG. 11 is a diagram that illustrates an example of a calculation for determining the barycenter of plasma.

A through E of FIG. 12 are diagrams that illustrate a control pattern that precludes detection of the energy of EUV light during a burst operation in a first modification of the second embodiment.

Figure 13:
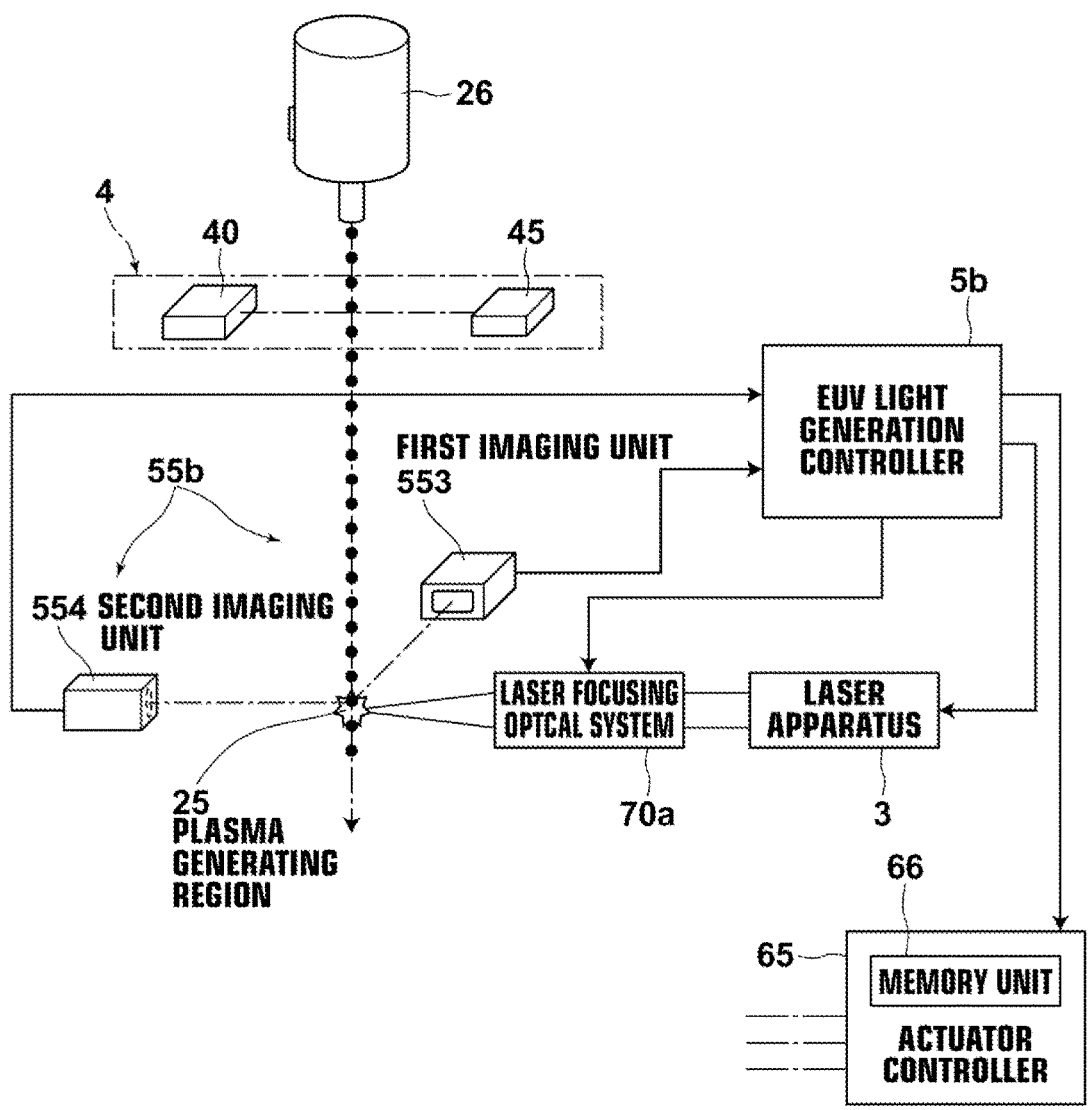

FIG. 13 is a diagram that illustrates a case in which an imaging device is employed as a focusing position detecting unit in a second modification of the second embodiment.

A through E of FIG. 14 are diagrams that illustrate the relationships among the energy of EUV light, an amount of shift of a laser focusing position in the Y direction, and the amount of control exerted by each actuator during a burst operation in the third embodiment.

DETAILED DESCRIPTION OF THE PREFERRED EMBODIMENTS

—Contents—
1. Overview of EUV Light Generating System
   1.1 Configuration
   1.2 Operation
2. Explanation of Terms
3. Comparative Example
   3.1 Configuration of the Comparative Example
   3.2 Operation of the Comparative Example
   3.3 Problem of the Comparative Example
4. First Embodiment
   4.1 Configuration of the First Embodiment
   4.2 Operation of the First Embodiment
   4.3 Functions and Effects of the First Embodiment
   4.4 Supplementary Example of Operation of the First Embodiment
5. Second Embodiment
   5.1 Configuration of the Second Embodiment
   5.2 Operation of the Second Embodiment
   5.3 Functions and Effects of the Second Embodiment
   5.4 Example of Calculation of Plasma Position (Barycenter of Plasma)
6. First Modification of the Second Embodiment
   6.1 Example of Control Pattern Generated by the First Modification of the Second Embodiment
   6.2. Operation of the First Modification of the Second Embodiment
   6.3 Functions and Effects of the First Modification of the Second Embodiment
7. Second Modification of the Second Embodiment
   7.1 Configuration of Focusing Position Detecting Unit in the Second Modification of the Second Embodiment
   7.2 Operation of the Second Modification of the Second Embodiment
8. Third Embodiment
   8.1 Configuration of the Third Embodiment
   8.2 Operation of the Third Embodiment Hereinafter, embodiments of the present disclosure will be described in detail while referring to the attached drawings.

The embodiments to be described below are illustrative examples of the present disclosure, and do not limit the scope of the present disclosure. In addition, not all of the configurations and operations of the embodiments to be described below are necessarily essential configurations and operations of the present disclosure. Note that common constituent elements will be denoted by the same reference numerals, and redundant descriptions will be omitted.

In the following description, "extreme ultraviolet light" may be abbreviated and also referred to as "EUV light".

1. Overview of EUV Light Generating System 1.1 Configuration

Figure 1:
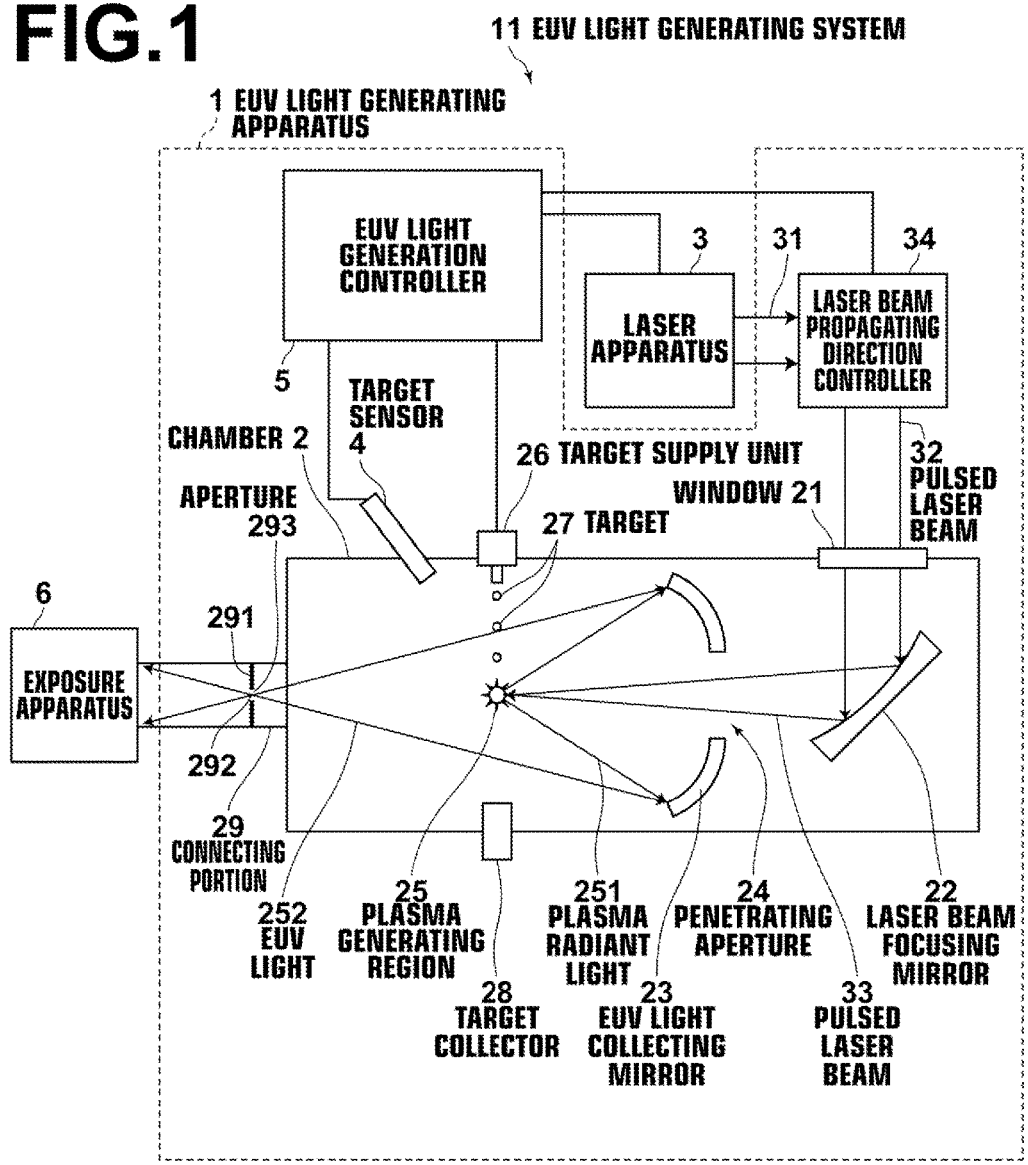
FIG. 1 is a diagram that schematically illustrates the configuration of an exemplary extreme ultraviolet light generating system of the LPP type.

FIG. 1 is a diagram that schematically illustrates the configuration of an exemplary EUV light generating system of the LPP type. An EUV light generating apparatus 1 may be employed with at least one laser apparatus 3. A system that includes the EUV light generating apparatus 1 and the laser apparatus 3 will be referred to as an EUV light generating system 11. As illustrated in FIG. 1 and as will be described in detail later, the EUV light generating apparatus 1 may include a chamber 2 and a target supply unit 26. The chamber 2 may be sealable. The target supply unit 26 may be provided such that it penetrates through on a wall of the chamber 2, for example. The material which is supplied by the target supply unit 26 as a target 27 may include, tin, terbium, gadolinium, lithium, xenon, or any combination including two or more thereof, but is not limited to these materials.

A wall of the chamber 2 may have at least one penetrating aperture therethrough. A window 21 may be provided at the penetrating aperture. A pulsed laser beam 32 which is output from the laser apparatus 3 may pass through the window 21. An EUV light collecting mirror 23 having a spheroidal reflective surface, for example, may be provided in the chamber 2. The EUV light collecting mirror 23 may have a first focal point and a second focal point. The surface of the EUV light collecting mirror 23 may have a multi layered reflective film, in which molybdenum layers and silicon layers are alternately laminated, formed thereon, for example. It is preferable for the EUV light collecting mirror 23 to be provided such that the first focal point is positioned in a plasma generating region 25, and the second focal point is positioned at an intermediate focal point (IF) 292. The EUV light collecting mirror 23 may have a penetrating aperture 24 formed in the center thereof, and a pulsed laser beam 33 may pass through the penetrating aperture 24.

The EUV light generating apparatus 1 may include an EUV light generation controller 5, a target sensor 4, and the like. The target sensor 4 may have an image capturing function, and may be configured to detect at least one of the presence, the trajectory, the position, the velocity, etc. of a target 27.

In addition, the EUV light generating apparatus 1 may include a connecting portion 29 that causes the interior of the chamber 2 to be in communication with the interior of an exposure apparatus 6. A wall 291 having an aperture 293 may be provided in the connecting portion 29. The wall 291 may be provided such that the aperture 293 is positioned at the second focal point of the EUV light collecting mirror 23.

Further, the EUV light generating apparatus 1 may include a laser beam propagating direction controller 34, a laser beam collecting mirror 22, a target collecting unit 28 configured to collect the target 27, and the like. The laser beam propagating direction controller 34 may be equipped with an optical element for regulating the propagating direction of a laser beam, and an actuator for adjusting the position, orientation, etc. of the optical element.

1.2 Operation

Referring to FIG. 1, a pulsed laser beam 31 which is output from the laser apparatus 3 may propagate via the laser beam propagating direction controller 34, pass through the window 21 as the pulsed laser beam 32, and then enter the chamber 2. The pulsed laser beam 32 may propagate through the chamber 2 along at least one laser beam path, be reflected by the laser beam collecting mirror 22, and be radiated to at least one target 27 as the pulsed laser beam 33.

The target supply unit 26 may be configured to output the target 27 toward the plasma generating region 25 in the interior of the chamber 2. The target 27 may be irradiated with at least one pulse which is included in the pulsed laser beam 33. The target 27 which is irradiated with the pulsed laser beam turns into plasma, and plasma radiant light 251 is generated from the plasma. EUV light 252, which is included in the plasma radiant light 251, may be selectively reflected by the EUV light collecting mirror 23. The EUV light 252 which is reflected by the EUV light collecting mirror 23 may be focused at the intermediate focal point 292 and output to the exposure apparatus 6. Note that a single target 27 may be irradiated with a plurality of pulses which are included in the pulsed laser beam 33.

The EUV light generation controller 5 may be configured to totally control the entire EUV light generating system 11. The EUV light generation controller 5 may be configured to process image data of the target 27 captured by the target sensor 4 or the like. The EUV light generation controller 5 may control the timing at which the target 27 is output, the output direction of the target 27, and the like, for example. The EUV light generation controller 5 may control at least one of the laser oscillation timing of the laser apparatus 3, the propagating direction of the pulsed laser beam 32, the focal position of the pulsed laser beam 33, and the like, for example. The above items which are controlled are merely examples, and other additional items may be controlled as necessary.

2. Explanation of Terms

Figure 2:
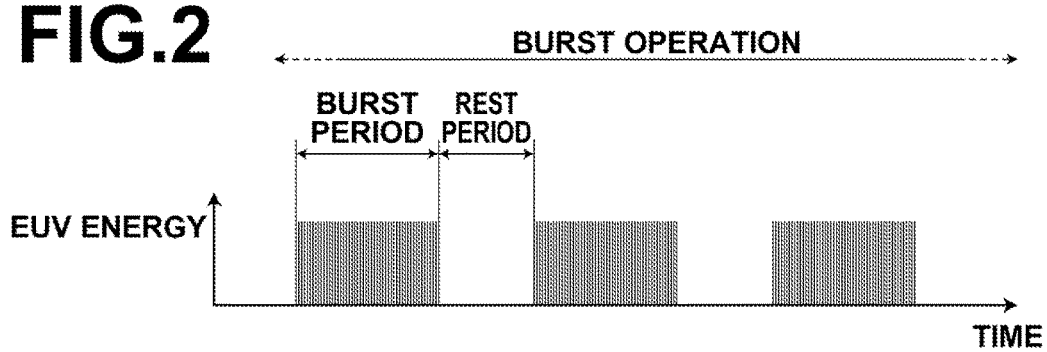
FIG. 2 is a diagram that illustrates each period that constitutes a burst operation.

FIG. 2 is a diagram that illustrates each period that constitutes a burst operation. The vertical axis indicates the intensity of the energy of EUV light, and the horizontal axis indicates elapsed time. Note that the expression "the energy of EUV light" may be abbreviated and also referred to as "EUV energy".

The terms which are utilized in the present disclosure are defined as follows.

Burst Operation: The EUV light generating system may output EUV light by a burst operation. As illustrated in FIG. 2, a burst operation is an operation that repeats burst periods during which EUV light is output at a constant repetition frequency for a certain period, and rest periods during which EUV light is not output for a predetermined period. A pulsed laser beam is output during the burst periods. Output of the pulsed laser beam is ceased, or propagation of the pulsed laser beam to the plasma generating region is suppressed, during the rest periods.

Burst Pattern: A burst pattern is defined by any one or a combination of the following data: the energy of EUV light during the burst periods, the repetition frequency at which EUV light is output during the burst periods, the output pulse number of EUV light during the burst periods or the length of the burst periods, the number of burst periods, and the length of the burst rest periods. Note that the burst pattern is input as a command by the exposure apparatus.

Plasma Generating Region: This refers to a region at which generation of plasma in order to output EUV light is initiated. In order for the generation of plasma to be initiated within the plasma generating region, it is necessary for a target to be supplied into the plasma generating region, and for a pulsed laser beam to be focused in the plasma generating region at the timing that the target reaches the plasma generating region. In the following description, it will be assumed that the target is supplied to the plasma generating region at the timing that the plasma generating region is irradiated with the pulsed laser beam.

3. Comparative Example

3.1 Configuration of the Comparative Example

Figure 3:
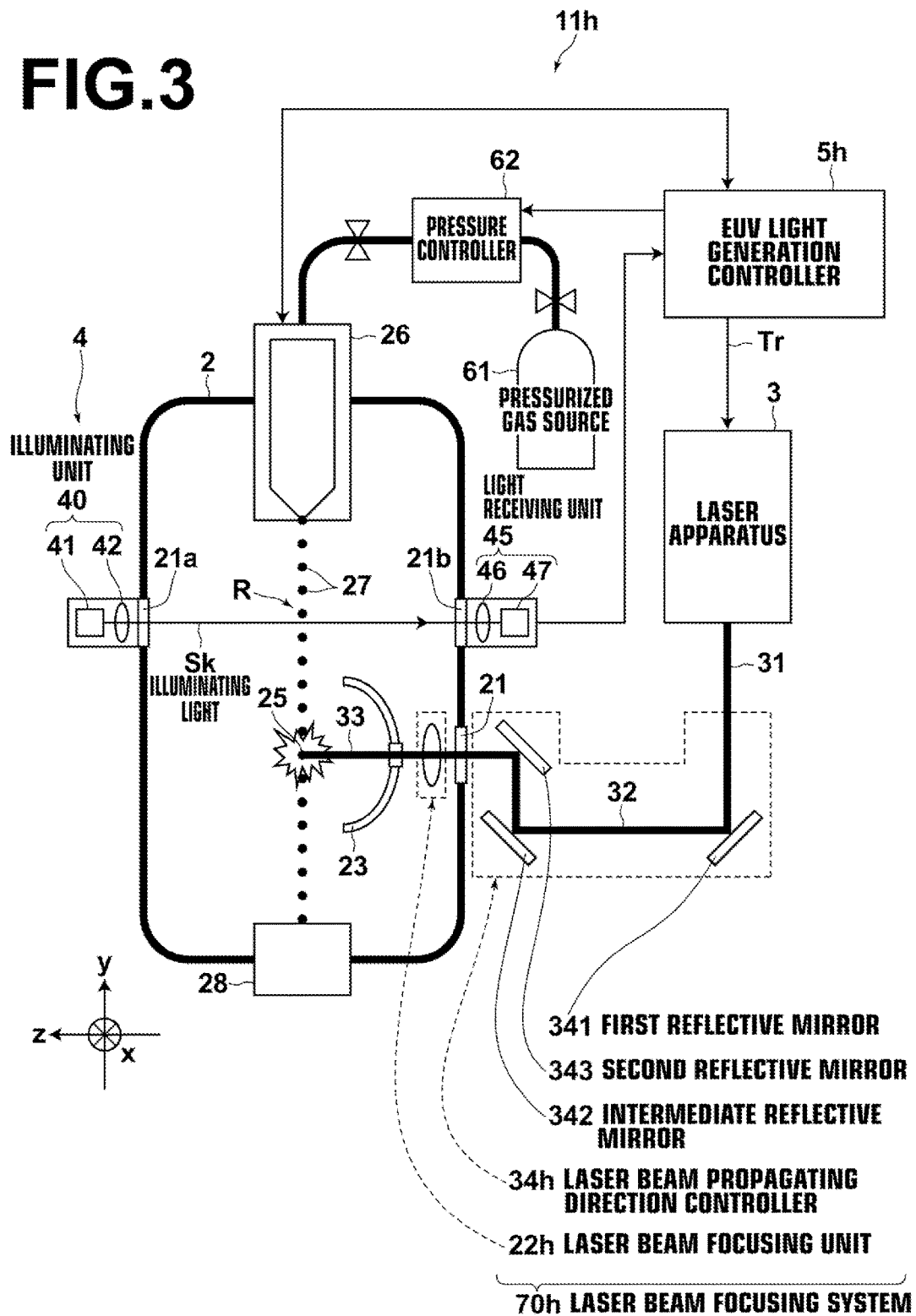
FIG. 3 is a partial sectional diagram that illustrates the configuration of an extreme ultraviolet light generating system of a comparative example.

FIG. 3 illustrates the configuration of an EUV light generating system of a comparative example. Constituent elements of the comparative example which are the same as those of the Examples will be denoted by the same reference numerals, and redundant descriptions will be omitted.

An EUV light generating system 11h may be equipped with a chamber 2 that generates EUV light within the interior thereof.

A laser beam focusing unit 22h, an EUV light collecting mirror 23, and a target collector 28 may be provided within the interior of the chamber 2.

In addition, the chamber 2 may be equipped with a target supply unit 26 for introducing a target 27. The target supply unit 26 may be provided to penetrate through the chamber 2.

A molten target substance may be stored in the interior of the target supply unit 26. The pressure of a gas which is supplied from a pressurized gas source 61 may be adjusted by a pressure adjustor 62 and the gas may be provided to the target supply unit 26. The target supply unit 26 may be configured to output the target 27 under pressure of argon gas which is supplied by the pressurized gas source 61.

Further, the chamber 2 may be equipped with a target sensor 4 that detects the timings at which the target 27, which is sequentially supplied by the target supply unit 26, passes through a predetermined position. The target sensor 4 may be equipped with an illuminating unit 40 and a light receiving unit 45.

The illuminating unit 40 may include a CW laser light source 41 and an illuminating optical system 42. The illuminating unit 40 may be configured and arranged to output illuminating light Sk to a predetermined position R along a target trajectory.

Note that the target trajectory may be an ideal path of progression of the target 27 which is output by the target supply unit 26. Alternatively, the target trajectory may be a path of progression of the target 27 according to the design of the target supply unit 26. The target collector 28 may be provided at a position toward which the target trajectory extends.

The light receiving unit 45 may include a light receiving optical system 46 and a light sensor 47. The light receiving unit 45 may be configured and arranged to receive the illuminating light Sk which is output by the illuminating unit 40 and has passed through the predetermined position R along the target trajectory.

The illuminating light Sk which is output by the CW laser light source 41 and has passed through a window 21a provided in a wall surface of the chamber 2 propagates to pass through the predetermined position R along the target trajectory. The illuminating light Sk which has passed through the predetermined position R may reach and be received by the light sensor 47 after passing through a window 21b provided in a wall surface of the chamber 2 that faces the window 21a and the light receiving optical system 46.

A laser apparatus 3 for turning the target 27 into plasma to generate EUV light may be provided at the exterior of the chamber 2.

In addition, a laser beam propagating direction controller 34h through which a pulsed laser beam 31 which is output by the laser apparatus 3 propagates and which determines the propagating direction of the pulsed laser beam 31 may be provided at the exterior of the chamber 2.

In addition, the laser beam focusing unit 22h provided in the interior of the chamber 2 may focus a pulsed laser beam 32 which is output from the laser beam propagating direction controller 34h.

A laser beam focusing system 70h may include the laser beam propagating direction controller 34h provided at the exterior of the chamber 2 and the laser beam focusing unit 22h provided in the interior of the chamber 2.

The pulsed laser beam 31 which is output by the laser apparatus 3 may be focused toward the plasma generating region 25 via the laser beam focusing unit 22h, by entering the laser beam propagating direction controller 34h, and passing through the window 21 provided in the wall surface of the chamber 2.

Note that an EUV light generation controller 5h, which is connected to the light receiving unit 45 of the target sensor 4, the laser apparatus 3, the target supply unit 26, the pressure adjustor 62, etc., may be provided.

3.2 Operation of the Comparative Example

The target supply unit 26 may output the target 27 toward the plasma generating region 25 based on a command from the EUV light generation controller 5h. Here, the target 27 may be a droplet. Note that the target in the droplet state will also be referred to as a "droplet". A configuration may be adopted, in which the amount of the illuminating light Sk which is received by the light receiving unit 45 decreases, by the target 27 passing through the predetermined position R and shielding a portion of the illuminating light Sk.

The EUV light generation controller 5h may output a laser oscillation trigger signal Tr, at a timing which is the timing at which the amount of the illuminating light Sk received by the light receiving unit 45 becomes less than or equal to a threshold value with a predetermined delay time added thereto.

This delay time may be determined based on the velocity of the target 27, the distance from the predetermined position R to the plasma generating region 25, and the amount of time between the timing at which the laser oscillation trigger signal Tr is input to the laser apparatus 3 to the timing at which the pulsed laser beam 31 output based on the laser oscillation trigger signal Tr reaches the plasma generating region 25.

The laser apparatus 3, to which the laser oscillation trigger signal Tr is input, may output the pulsed laser beam 31.

The pulsed laser beam 31 may be focused and radiated to the target 27 which is supplied to the plasma generating region 25 via the laser beam propagating direction controller 34h and the laser beam focusing unit 22h.

The target 27 which is irradiated with the pulsed laser beam 33 turns into plasma and radiates EUV light.

3.3 Problem of the Comparative Example

FIG. 4 is a partial magnified diagram of the configuration of the laser beam focusing unit.

The optical elements provided in the laser beam propagating direction controller 34h and the laser beam focusing unit 22h that constitute the laser beam focusing system 70h may be deformed or displaced due to heat which is generated by being irradiated with the pulsed laser beam 32.

For example, the laser beam focusing unit 22h may be configured as illustrated in FIG. 4. That is, the laser beam focusing unit 22h may include a concave mirror 222 for collecting the pulsed laser beam 32, and the concave mirror 222 may be an off axis paraboloid mirror. The laser beam focusing unit 22h may further include a convex mirror 221 at a position that faces the concave mirror 222, and the convex mirror 221 may be an ellipsoid mirror.

The pulsed laser beam 33 may be focused toward the plasma generating region 25 with a high NA, by being reflected by the convex mirror 221 and the concave mirror 222. The laser beam focusing unit 22h may include a plate 223, on which the convex mirror 221 and the concave mirror 222 are arranged. The plate 223 may be supported by the chamber 2.

In addition, the laser beam propagating direction controller 34h may include a first reflective mirror 341, an intermediate reflective mirror 342, and a second reflective mirror 343.

The pulsed laser beam 31 which is output from the laser apparatus 3 may pass through the first reflective mirror 341, the intermediate reflective mirror 342, the second reflective mirror 343, the convex mirror 221, and the concave mirror 222 in this order.

Plasma may be continuously generated by each target 27, which is continuously supplied to the plasma generating region 25 being sequentially irradiated with the pulsed laser beam 33. Plasma radiant light 251 which includes EUV light 252 is continuously radiated from the continuously generated plasma. There are cases in which the plasma radiant light 251 that passes through the penetrating apertures within the EUV light collecting mirror 23 will continuously heat the concave mirror 222.

The concave mirror 222 may be configured to have a high reflectance with respect to the wavelength of the pulsed laser beam 32. There are cases in which the concave mirror 222 has a low reflectance with respect to wavelengths which are included in the plasma radiant light 251 other than that of the pulsed laser beam 32. Therefore, the concave mirror 222 may absorb light having such other wavelengths and be heated.

The concave mirror 222 which is heated will thermally deform, and the focusing position of the pulsed laser beam 33 that passes through the reflective surface of the concave mirror 222 and is focused may become shifted away from the plasma generating region 25. For example, the focusing position of the pulsed laser beam 33 may gradually move away from the target 27 which is supplied to the plasma generating region. For this reason, the energy of the EUV light 252 radiated by the target 27, which is irradiated with the pulsed laser beam and turns into plasma, may decrease. This phenomenon may occur conspicuously while continuing burst operations.

A and B of FIG. 5 are diagrams that illustrate the relationship between shifts of the focusing position of pulsed laser beams with respect to targets, which are supplied to the plasma generating region, and the energy of EUV light, which is radiated accompanying such shifts. In A of FIG. 5, the vertical axis represents EUV energy and the horizontal axis represents elapsed time. In B of FIG. 5, the vertical axis represents the amount of shift between the target which is supplied to the plasma generating region and the focusing position of the pulsed laser beam, and the horizontal axis represents time.

As illustrated in A and B of FIG. 5, during output of EUV light at the beginning of the first burst period, the target 27 which is supplied to the plasma generating region 25 is appropriately irradiated with the pulsed laser beam 33, and therefore a predetermined EUV energy is output. However, the shift of the focusing position of the pulsed laser beam 33 with respect to the supplied target 27 becomes greater over time, and the EUV energy may decrease accordingly. The EUV energy greatly decreases particularly at the latter half of the burst period.

The energy of EUV light at the beginning of a second burst period which is executed after an intervening rest period may be less than the energy of EUV light at the beginning of the first burst period.

The temperature of the heated concave mirror 222 and the like decreases during the rest period. Therefore, the shift between the target which is supplied to the plasma generating region 25 and the focusing position of the pulsed laser beam approaches an original state.

However, in the case that the shift does not completely return to the original state, the EUV energy at the beginning of a subsequent burst period may be lower than the EUV energy at the beginning of a previous burst period.

The shift in focusing position may be a shift of the focusing position of the pulsed laser beam with respect to the position of a target which is supplied to the plasma generating region, the position of the target being set in advance. Alternatively, the shift in focusing position may be a shift of the focusing position of the pulsed laser beam with respect to a position within the plasma generating region, which is set in advance. As a further alternative, the shift in focusing position may be a shift of the generation position of EUV light, which radiates by the target which is irradiated with the pulsed laser beam turning into plasma, with respect to a position within the plasma generating region, which is set in advance. Note that the position of the target may be the position of the barycenter thereof. In addition, the position of the plasma generating region may be the center position of the plasma generating region.

Note that not only the optical elements that constitute the laser beam focusing unit 22h, but also holding portions of the optical elements may be deformed or displaced by being heated by the plasma radiant light 251, scattered light of the pulsed laser beam 32, etc., in the same manner as the optical elements.

The optical elements and holding portions of the laser beam propagating direction controller 34h may be deformed or displaced by being heated in the same manner as the laser beam focusing unit 22h as well. Note that the displacement may be changes in position or changes in orientation, such as inclination.

As described above, the optical path along which the pulsed laser beam 31 propagates may shift away from an appropriate optical path, because the optical elements and the holding portions thereof that constitute the laser beam focusing system 70h become deformed or displaced due to being heated.

For these reasons, there is a problem that the EUV energy, generated from the targets which are irradiated with the pulsed laser beam, will decrease.

4. First Embodiment 4.1 Configuration of the First Embodiment

FIG. 6 is a partial cross sectional diagram that illustrates the schematic configuration of an EUV light generating system according to a first embodiment. FIG. 7 is a magnified diagram that illustrates a laser beam focusing unit of the first embodiment.

An EUV light generating system 11a of the first embodiment may be the EUV light generating system 11h of the comparative example, in which the configurations of the EUV light generation controller 5h and the laser beam focusing system 70h are changed. The other configurations of the EUV light generating system 11a may be the same as those of the EUV light generating system 11h of the comparative example.

The EUV light generating system 11a may be an EUV light generating system that repetitively outputs EUV light, which is generated from targets which are irradiated with a pulsed laser beam and turns into plasma.

The EUV light generating system 11a may be equipped with a chamber 2, a target supply unit 26 that sequentially supplies a target 27 to a plasma generating region 25 which is set within the chamber 2, and a laser apparatus 3 that outputs a pulsed laser beam 31.

In addition, the EUV light generating system 11a may be equipped with a laser beam focusing system 70a that focuses the output pulsed laser beam 31, and actuators 345, 346, and 225 which are connected to the laser beam focusing system 70a and adjust the focusing position of a pulsed laser beam 33. Note that the first actuator 345, the second actuator 346, and the actuator 225 will also be collectively referred to as "the actuators 345, 346, and 225". In addition, the first actuator 345 and the second actuator 346 will also be referred to as "mirror actuators". Further, the actuator 225 will also be referred to as a "unit actuator".

Further, the EUV light generating system 11a may be equipped with an EUV light generation controller 5a that controls the EUV light generating system 11a based on burst patterns. In addition, the EUV light generating system 11a may be equipped with an actuator controller 65 that controls the actuators under feedforward control, in order to compensate for shifts of the focusing position of the pulsed laser beam 33 with respect to the plasma generating region 25 that occur during burst operations.

The shifts of the focusing position may be shifts of the focusing position of the pulsed laser beam 33 with respect to the target which is supplied to the plasma generating region 25.

In addition, the actuator controller 65 may have control patterns for compensating for shifts corresponding to the burst patterns stored in a memory unit 66 in advance. The memory unit 66 may be provided as a component of the actuator controller 65. Further, the actuator controller 65 may control the actuators under feedforward control such that shifts are compensated for employing a control pattern corresponding to a burst pattern, when the EUV light generating system 11a is controlled based on the burst pattern.

The laser beam focusing system 70a may be equipped with a laser beam propagating direction controller 34a that includes a reflective mirror for regulating the propagating direction of a pulsed laser beam 32. In addition, the laser beam focusing system 70a may be equipped with a laser beam focusing unit 22a that includes a reflective mirror for focusing the pulsed laser beam 32. The laser beam propagating direction controller 34a may be provided upstream of the laser beam focusing unit 22a. The actuator 225 may be connected to the laser beam focusing unit 22a and may adjust the focusing position of the laser beam. The first and second actuators 345 and 346 may be connected to the laser beam propagating direction controller 34a and may adjust the focusing position of the pulsed laser beam. The response speeds of the first and second actuators 345 and 346, which are mirror actuators, may be faster than the response speed of the actuator 225, which is a unit actuator.

The actuator 225 may hold a plate 223 of the laser beam focusing unit 22a in a movable manner. A configuration may be adopted in which a convex mirror 221 and a concave mirror 222 of the laser beam focusing unit 22a translate along each of the X, Y, and Z axes of FIG. 7, for example, by driving the actuator 225. The actuator 225 may be supported by the chamber 2.

The first and second actuators 345 and 346 may respectively be connected to first and second reflective mirrors 341 and 343 of the laser beam propagating direction controller 34a. A configuration may be adopted in which the position and/or the inclination of the first and second reflective mirrors 341 and 343 are adjusted, by driving the first and second actuators 345 and 346. Each of the first and second reflective mirrors 341 and 343 may be a planar reflective mirror.

In addition, the laser beam propagating direction controller 34a may include an intermediate reflective mirror 342 for changing the direction of an optical path, along an optical path that passes via the first and second reflective mirrors 341 and 343.

The first and second actuators 345 and 346 may individually adjust the inclinations of each of the first and second reflective mirrors 341 and 343, to move the focusing position of the pulsed laser beam 33 in different directions independently.

That is, each of the first and second actuators 345 and 346 may move the focusing position of the pulsed laser beam 33 in a different direction within a plane (the X-Y plane in FIG. 6) that includes the trajectory of the target 27 which passes through the plasma generating region 25. The different directions may be the Y direction and the X direction, which are perpendicular to each other. Note that the Y direction illustrated in FIG. 6 may be set to be parallel to the trajectory of the target 27 which passes through the plasma generating region 25.

The actuator 225 may move the focusing position of the pulsed laser beam which is reflected by the convex mirror 221 and the concave mirror 222 which are held on the plate 223, by changing the position and/or inclination of the plate 223 of the laser beam focusing unit 22a.

The actuator 225 may be an X-Y-θ stage which is capable of moving the position of the plate 223 in the direction of arrow Y in FIG. 7, and also capable of changing the inclination of the plate 223 with respect to the X-Y plane. Note that a piezoelectric element, a rotary actuator, a linear motor, etc. may be employed as the actuator that drives the X-Y-θ stage.

In addition, the actuator 225 may move the focusing position of the pulsed laser beam 33 along the X-Y plane, by translating the plate 223 with respect to the X-Y plane of FIG. 6. The X-Y plane may be a plane that includes the trajectory of the target 27 which passes through the plasma generating region 25. In addition, the actuator 225 may translate the plate 223 in the Y direction of FIG. 7, to move the focusing position of the pulsed laser beam 33 in the Y direction. The Y direction may be the Y direction which is parallel to the trajectory of the target 27 which passes through the plasma generating region 25.

Each of the first and second actuators 345 and 346 which are connected to the laser beam propagating direction controller 34a as well as the actuator 225 which is connected to the laser beam focusing unit 22a may respectively be connected to the actuator controller 65.

Note that control patterns which are input from the exterior may be stored in the memory unit 66. In addition, the control patterns may be those which are corresponding to specific burst patterns.

4.2 Operation of the First Embodiment

An external apparatus such as an exposure apparatus may specify a burst pattern, with the EUV light generation controller 5a, which is to be employed when EUV light is generated. The burst pattern may be selected from among the burst patterns which are stored in the EUV light generation controller 5a. Alternatively, the burst pattern may be that which is input to the EUV light generation controller 5a by an operator.

The memory unit 66 provided in the actuator controller 65 may store the control patterns for suppressing shifting of the focusing position of the pulsed laser beam 33, corresponding to predetermined burst patterns, in advance. The amounts of control of the control patterns which are stored in the memory unit 66 may be obtained by experimentation or computer simulations.

Note that one burst pattern may be specified at the EUV light generation controller 5a, and one control pattern correlated thereto may be stored in the memory unit 66. Alternatively, a plurality of burst patterns may be specified at the EUV light generation controller 5a, and control patterns corresponding to each of the plurality of burst patterns may be stored in the memory unit 66.

The EUV light generation controller 5a may notify the actuator controller 65 of the specified burst pattern. The actuator controller 65 may obtain a control pattern corresponding to the notified burst pattern from the memory unit 66.

The actuator controller 65 may control the first and second actuators 345 and 346 as well as the actuator 225 according to amounts of control of a control pattern corresponding to a burst pattern by feedforward control when the EUV light generating system 11a executes operations based on the burst pattern.

The positions and/or inclinations of the first and second reflective mirrors 341 and 343 may be adjusted to a predetermined state according to the amounts of control of the control pattern prior to initiation of a burst period, by the feedforward control. Similarly, the position and/or inclination of the plate 223, on which the convex mirror 221 and the concave mirror 222 are provided, may be adjusted to a predetermined state according to the amounts of control of the control pattern prior to initiation of a burst period, by the feedforward control.

Thereafter, when the operation transitions to the burst period, the pulsed laser beam 31 which is output by the laser apparatus 3 may pass through the laser beam focusing system 70a, and the target 27 which is supplied to the plasma generating region 25 may be irradiated therewith.

The target 27 may turn into plasma by being irradiated, and EUV light may be radiated.

During the burst period, the actuator controller 65 may control each of the actuators 345, 346, and 225 by feedforward control.

The actuator controller 65 may execute feedforward control at least during output of EUV light at the beginning of each burst period which is included in a burst operation. The actuator controller 65 may execute feedforward control during a plurality of EUV light outputs from the beginning of each burst period which is included in a burst operation.

The actuator controller 65 may execute feedforward control only during output of extreme ultraviolet light at the beginning of each burst period which is included in a burst operation. Note that the actuator controller 65 may obtain synchronization signals which are necessary to execute the various items of feedforward control from the EUV light generation controller 5a.

4.3 Functions and Effects of the First Embodiment

Shifts of the position of the focusing position of the pulsed laser beam with respect to the plasma generating region are suppressed by the configurations and operations described above. As a result, stabilized EUV light can be obtained.

4.4 Supplementary Example of Operation of the First Embodiment

A case in which the focusing position of the pulsed laser beam gradually shifts in the Y direction with respect to the target which is supplied to the plasma generating region 25 during burst periods indicated in FIGS. 6 and 7 will be described with reference to A through E of FIG. 8, as an example of feedforward control.

A through E of FIG. 8 illustrate conditions during a burst operation which is executed according to a predetermined burst pattern. Here, the inclination of the first reflective mirror 341 in a θ1 direction, the inclination of the second reflective mirror 343 in a θ2 direction, and the position of the plate 223 in the Y direction may be three parameters which are the targets of feedforward control.

As illustrated in A of FIG. 8, the EUV energy becomes substantially constant during each burst period after the burst operation is initiated.

Further, as illustrated in B of FIG. 8, some variation can be seen in the shift in the Y direction of the focusing position of the pulsed laser beam 33 with respect to the target 27 which is supplied to the plasma generating region, but the amount of shift is suppressed to be small.

Further, as illustrated in C through E of FIG. 8, the inclination θ1 of the first reflective mirror 341, the inclination θ2 of the second reflective mirror 343, and the position of the plate 223 in the Y direction change according to a control pattern during the burst periods.

Still further, during rest periods, the inclinations of the first and second reflective mirrors 341 and 343 as well as the position of the plate 223 change greatly according to the control pattern corresponding to output of EUV light at the beginning of a subsequent burst period.

The amounts of control of the control pattern for controlling the first and second actuators 345 and 346 as well as the actuator 225 by feedforward control in this manner may be generated in advance, corresponding to a burst pattern.

Note that a plurality of different control patterns may be generated corresponding to a burst pattern, and the plurality of different control patterns may be stored in the memory unit 66. Alternatively, only one control pattern corresponding to a burst pattern may be stored in the memory unit 66. As a further alternative, burst patterns may be input as commands by the exposure apparatus 6.

A control pattern which is determined by its correspondence with a burst pattern may include data such as those listed below.

1) The amounts of control of the control pattern may be amounts of control exerted on each actuator, corresponding to the number of repetitive outputs of EUV light from initiation of a burst operation. Note that the number of repetitive outputs of EUV light may be designated as the number of pulses of EUV light, which is output as pulses.

2) The amounts of control of the control pattern may be amounts of control exerted on each actuator, corresponding to the number of burst periods from initiation of a burst operation.

3) The control pattern may be amounts of control exerted on each actuator corresponding to the number of burst periods from initiation of a burst operation and the number of repetitive outputs of EUV light.

4) The control pattern may be amounts of control exerted on each actuator corresponding to the passage of time from initiation of a burst operation.

A case in which the focusing position of the pulsed laser beam shifts in the Y direction illustrated in FIGS. 6 and 7 with respect to the target was exemplified as a description of the feedforward control exerted in the first embodiment. However, the direction in which the focusing position of the pulsed laser beam shifts may not only be the Y direction. Accordingly, a control pattern corresponding to a burst pattern may be generated with respect to controllable axes other than the rotating axes corresponding to control of the first and second reflective mirrors 341 and 343 as well as the linear axis corresponding to control of the plate 223 illustrated in FIGS. 6 and 7, and applied during a burst operation in a manner similar to that above. To facilitate understanding, cases in which the focusing position of a pulsed laser beam shifts in the Y direction will be described with respect to other embodiments to be described below. However, control patterns may be generated and applied during burst operations in cases that shifts occur in the X direction and the Z direction in addition to the Y direction as well. For example, control patterns may be generated with the inclination of the first reflective mirror 341 in the θ1 direction, the inclination of the second reflective mirror 343 in a direction perpendicular to the θ2 direction, and the position of the plate 223 in the X direction and the Y direction as parameters. Alternatively, control patterns may be generated with the inclination of the first reflective mirror 341 in a direction perpendicular to the θ1 direction, the inclination of the second reflective mirror 343 in the θ2 direction, and the position of the plate 223 in the X direction, the Y direction, and the Z direction as parameters. Here, the "inclination . . . in a direction perpendicular to the θ2 direction" and the "inclination . . . in a direction perpendicular to the θ1 direction" may be inclinations about axes which are perpendicular to the rotating axes (θ1 and θ2 axes) in the θ1 and θ2 directions (circumferential directions).

In addition, the EUV light generation controller 5a may assign a reference number to each burst pattern which is input as a command from the exposure apparatus 6, and store the burst patterns in the memory unit 66 in a manner such as that shown in Table 1.

The parameters that constitute the burst pattern shown in Table 1 may be items such as those described below. That is, the parameters may be the target value of EUV energy to be generated, the repetition frequency of the output of repetitively output EUV light during burst periods, and the length of the burst rest periods.

For example, in the uppermost burst pattern in Table 1 that corresponds to reference number 111, the target value of EUV energy is E1, the repetition frequency during burst periods is 100 (kHz), and the length of the burst rest periods is T1 (ms).

TABLE 1

| Burst Pattern | | | EUV Energy Target Value | Repetition Frequency During Burst Periods (kHz) | Burst Rest Periods (mS) |
|---|---|---|---|---|---|
| 1 | 1 | 1 | E1 | 100 | T1 |
|   |   | 2 | E1 | 100 | T2 |
|   |   | . | . | . | . |
|   |   | . | . | . | . |
|   | 2 | 1 | E1 | 75 | T1 |
|   |   | . | . | . | . |
|   |   | . | . | . | . |
|   | 3 | 1 | E1 | 50 | T1 |
| . | . | . | . | . | . |
| . | . | . | . | . | . |
| N | 1 | 1 | EN | 100 | T1 |
| . | . | . | . | . | . |
| . | . | . | . | . | . |
| N | N | N | EN | 30 | TN |

In addition, the actuator controller 65 may store amounts of control for control patterns that correspond to the reference numbers of the burst patterns, as shown in Table 2.

The rows of amounts of control corresponding to the burst patterns may be stored as a control pattern for each bust pattern.

Here, as one example, the amounts of control of the inclination θ1 of the first reflective mirror 341 and the inclination θ2 of the second reflective mirror 343 may be stored as a control pattern corresponding to "Burst No." and "Pulse No. from Beginning of Burst". Here, the "Burst No." is the ordinal number of bursts from initiation of a burst operation, and the "Pulse No. from Beginning of Burst" is the ordinal number of pulses from the beginning of the burst in each burst period.

In Table 2, the amounts of control of a control pattern corresponding to the burst pattern having reference number 111 are shown as the uppermost control pattern in the table that shows control patterns for θ1.

In greater detail, the row of amounts of control of the control pattern that corresponds to reference number 111 shows data denoted as "α111-1-1" as the amount of control for θ1 for Burst No. "1" and Pulse No. from Beginning of Burst "1". In addition, data dented as "α111-1-2" is shown as the amount of control θ1 for Burst No. "1", and Pulse No. from Beginning of Burst "2". Further, data dented as "α111-1-3" is shown as the amount of control θ1 for Burst No. "1", and Pulse No. from Beginning of Burst "3".

The inclinations of each of the first and second reflective mirrors 341 and 343 may be adjusted by sequentially applying these amounts of control of the control pattern that correspond to the "Burst No." and the "Pulse No. from Beginning of Burst" to control the first and second actuators 345 and 346. Thereby, the focusing position of the pulsed laser beam may be controlled by feedforward control, by controlling the first and second reflective mirrors 341 and 343 via the first and second actuators 345 and 346.

5. Second Embodiment

5.1 Configuration of Second Embodiment

FIG. 9 is a diagram that illustrates the configuration of an EUV light generating system of a second embodiment.

An EUV light generating system 11*b* of the second embodiment may be the EUV light generating system 11*a* of the first embodiment, further comprising a focusing position detecting unit 55 that detects shifts of a focusing position. Further, the EUV light generating system 11*b* may derive control patterns from the shifts of the focusing position which are detected by the focusing position detecting unit 55. The other configurations may be the same as those of the first embodiment.

An EUV light generation controller 5*b* may generate control patterns from the shifts of the focusing position which are detected by the focusing position detecting unit 55. In addition, the focusing position detecting unit 55 may detect the plasma radiant light 251 which radiates by the target 27 turning into plasma by being irradiated with the pulsed laser beam 33. The focusing position detecting unit 55 may detect light energy of the plasma radiant light 251.

The light energy which is detected by the focusing position detecting unit 55 may be the energy of EUV light included in the plasma radiant light 251. For example, the focusing position detecting unit 55 may be EUV sensors 551 and 552 that detect the intensity of EUV energy at different positions from each other.

Here, the focusing position of the pulsed laser beam 33 may be considered to be the position at which plasma is generated by the target 27 being irradiated with the pulsed laser beam 33. In addition, the position at which plasma is generated may be considered to be the position where EUV light, which constitutes a portion of the plasma radiant light 251, is generated. Accordingly, the focusing position of the

TABLE 2

| | | Burst No. | | | | | | |
|---|---|---|---|---|---|---|---|---|
| | | 1 | | | ... | M | | |
| | | Pulse No. from Beginning of Burst | | | | | | |
| | | 1 | 2 | 3 | ... | 1 | 2 | 3 | ... |
| | | Control Pattern for θ1 | | | | | | |
| Burst Pattern | 111 | α111-1-1 | α111-1-2 | α111-1-3 | ... | α111-M-1 | α111-M-2 | α111-M-3 | ... |
| | 112 | α112-1-1 | α112-1-2 | α112-1-3 | ... | α112-M-1 | α112-M-2 | α112-M-3 | ... |
| | . | . | . | . | ... | . | . | . | ... |
| | 121 | α121-1-1 | α121-1-2 | α121-1-3 | ... | α121-M-1 | α121-M-2 | α121-M-3 | ... |
| | 122 | α122-1-1 | α122-1-2 | α122-1-3 | ... | α122-M-1 | α122-M-2 | α122-M-3 | ... |
| | . | . | . | . | ... | . | . | . | ... |
| | NNN | αNNN-1-1 | αNNN-1-2 | αNNN-1-3 | ... | αNNN-M-1 | αNNN-M-2 | αNNN-M-3 | ... |
| | | Control Pattern for θ2 | | | | | | |
| Burst Pattern | 111 | β111-1-1 | β111-1-2 | β111-1-3 | ... | β111-M-1 | β111-M-2 | β111-M-3 | ... |
| | 112 | β112-1-1 | β112-1-2 | β112-1-3 | ... | β112-M-1 | β112-M-2 | β112-M-3 | ... |
| | . | . | . | . | ... | . | . | . | ... |
| | 121 | β121-1-1 | β121-1-2 | β121-1-3 | ... | β121-M-1 | β121-M-2 | β121-M-3 | ... |
| | 122 | β122-1-1 | β122-1-2 | β122-1-3 | ... | β122-M-1 | β122-M-2 | β122-M-3 | ... |
| | . | . | . | . | ... | . | . | . | ... |
| | NNN | βNNN-1-1 | βNNN-1-2 | βNNN-1-3 | ... | βNNN-M-1 | βNNN-M-2 | βNNN-M-3 | ... | pulsed laser beam 33 may be derived by performing calculations based on the detection results of the position at which the EUV light is generated, detected by the plurality of EUV sensors. The amount of shift of the focusing position of the pulsed laser beam 33 may be calculated based on a difference between the focusing position of the pulsed laser beam 33 and a position in the plasma generating region 25, which is determined in advance.

The EUV light generation controller 5b may derive the amount of shift of the focusing position of the pulsed laser beam 33, based on the EUV energy which is detected by the EUV sensors 551 and 552 during repetitive output of EUV light based on a burst pattern, and generate a control pattern. Further, the EUV light generation controller 5b may store the control pattern, which is generated corresponding to the burst pattern, in the memory unit 66 of the actuator controller 65.

5.2 Operation of the Second Embodiment

A through E of FIG. 10 are diagrams that illustrate the manner in which the EUV light generation controller 5b derives the amount of shift of the focusing position of the pulsed laser beam 33 in the Y direction, based on detection of EUV energy by the EUV sensors 551 and 552.

1) The EUV light generating system 11b may repetitively output EUV light a predetermined number of times by irradiating the target 27 with the pulsed laser beam 33 during burst periods according to a predetermined burst pattern, without the actuator controller 65 exerting control.

As illustrated in C through E of FIG. 10, the inclinations of the first and second reflective mirrors 341 and 343 as well as the position of the plate 223 may be fixed throughout all of the periods during a burst operation. In addition, a shutter, which is not illustrated, may be closed such that EUV light is not output from the chamber 2 to the exposure apparatus 6 during this time.

2) Each of the plurality of EUV sensors 551 and 552 may detect the energy of EUV light which is included in the plasma radiant light 251 during the burst periods, and output detected values to the EUV light generation controller 5b. The EUV energy detected at this time may gradually decrease during the burst periods, as illustrated in A of FIG. 10.

3) The EUV light generation controller 5b may calculate the position at which EUV light is generated based on the detected values of EUV energy detected by each of the EUV sensors 551 and 552, and determine changes in the position at which plasma is generated during the burst periods. The formula for calculating the position at which EUV light is generated will be described later.

4) The EUV light generation controller 5b may calculate the amount of shift of the focusing position of the pulsed laser beam 33 based on a difference between the position at which plasma is generated, derived from the detected values of the EUV energy, and a position in the plasma generating region 25, which is determined in advance. The amount of shift may gradually increase during the burst periods, as illustrated in B of FIG. 10.

Note that the difference between the position at which plasma is generated and the position in the plasma generating region 25 within a spatial coordinate system may be designated as the amount of shift of the focusing position of the pulsed laser beam 33 with respect to the target 27 which is supplied to the plasma generating region 25.

5) The EUV light generation controller 5b may derive a control pattern for suppressing the shift of the focusing position by feedforward control, from the amount of shift of the focusing position which is obtained in the above manner.

That is, the EUV light generation controller 5b may derive a control pattern for adjusting the inclinations of the first and second reflective mirrors 341 and 343 as well as the position of the plate 223 with the actuators 345, 346, and 225 to suppress the shift of the focusing position.

6) The control pattern which is derived by the EUV light generation controller 5b may be correlated to the predetermined burst pattern and stored in the memory unit 66 of the actuator controller 65.

7) The actuator controller 65 may perform feedforward control employing the above control pattern during a burst operation according to the above predetermined burst pattern. The feedforward control which is performed based on such a control pattern may be similar to the control executed in the first embodiment, described previously with reference to A through E of FIG. 8.

8) The EUV light generation controller 5b may calculate an amount of shift based on detected EUV energy, to determine whether the amount of shift of the focusing position during burst operations is within an allowable range. If the amount of shift of the focusing position is within the allowable range, the control pattern may be finalized.

Meanwhile, if the amount of shift exceeds the allowable range regardless of the feedforward control employing the control pattern, the control pattern may be corrected, and output of EUV light according to the burst pattern may be executed employing the corrected control pattern. The EUV light which is output during this burst operation may be detected, and whether the shift of the focusing position is within the allowable range may be determined. These operations may be repeated until the amount of shift is within the allowable range, and then the control pattern may be finalized.

9) After the control pattern is finalized, the EUV light generation controller 5b correlates the control pattern to the above predetermined burst pattern, and stores the correlated control pattern in the memory unit 66.

10) During subsequent burst operations, the actuator controller 65 may obtain the control pattern which corresponds to the burst pattern from the memory unit 66. The actuator controller 65 may control the first and second actuators 345 and 346 as well as the actuator 225 according to the amounts of control indicated by the control pattern, by feedforward control.

Note that when EUV light is to be output from the chamber 2 to the exposure apparatus 6, the shutter which is not illustrated may be opened.

In connection with the control according to the control pattern, the control pattern may be generated in a manner similar to the case described above with respect to controllable axes other than the rotational axes of the first and second reflective mirrors 341 and 343 as well as axes of movement of the plate 223 in the Y direction.

5.3 Functions and Effects of the Second Embodiment

The EUV light generating system 11b itself may generate control patterns.

For this reason, even if various burst patterns are specified by the exposure apparatus 6, an appropriate control pattern may be easily generated for each of the burst patterns.

5.4 Example of Calculation of Plasma Position (Barycenter of Plasma)

FIG. 11 is a diagram that illustrates an example of a calculation for determining the barycenter of plasma which radiates EUV light.

For example, it may be assumed that the measured values of each of three EUV sensors, which are arranged in an Y-X plane perpendicular to the Z axis as illustrated in FIG. 11, are the values shown below. These measured values may be the values of EUV energy.

Measured Value of First EUV Sensor 55e1: E1 Measured Value of Second EUV Sensor 55e2: E2 Measured Value of Third EUV Sensor 55e3: E3

Here, in the case that a Y'-X' coordinate system is designated as a coordinate system that passes through the positions of the three EUV sensors, the barycenter (CentX', CentY') of plasma that radiates EUV light in the Y'-X' coordinate system may be expressed as shown below.

$$CentX'=(E2-E3)/(E2+E3) \quad (1)$$

$$CentY'=(E1-E3)/(E1+E3) \quad (2)$$

In the case that the angle formed by the X axis and the X' axis is θ[rad], for example, Formulae (1) and (2) may be converted to obtain the barycenter (CentX, CentY) of EUV light in the Y-X coordinate system.

Note that the Y-X coordinate system may be a coordinate system which is a mechanical standard of a stage and the like for adjusting the positions of the EUV sensors.

6. First Modification of the Second Embodiment 6.1 Example of Control Pattern Generated by the First Modification of the Second Embodiment A through E of FIG. 12 are diagrams that illustrate generation of a control pattern in a case in which the EUV sensors cannot detect EUV energy due to decreases in EUV energy during burst periods. A of FIG. 12 is a diagram that illustrates laser oscillation trigger signals during a burst period. B through E of FIG. 12 are diagrams that illustrate the manner in which periods that enable control employing a control pattern during a burst operation are extended.

In the case that burst periods are long or the shift of the focusing position of the pulsed laser beam during the burst periods is great, there may be cases in which the value of EUV energy which is detected during the burst periods will be less than the detection limit of the EUV sensors. Examples of a reason why such a phenomenon occurs may include cases in which the focusing position of the pulsed laser beam 33 is excessively shifted from a position within the plasma generating region 25 and the target 27 is not irradiated with the pulsed laser beam 33, or the generation of plasma is insufficient even if the target 27 irradiated with the pulsed laser beam 33.

In such cases, a control pattern to be employed throughout the entirety of the bust periods may be generated in the following manner.

6.2 Operation of the First Modification of the Second Embodiment

1) As illustrated in B of FIG. 12, the EUV light generating system 11b may sequentially irradiate the targets 27 which are supplied to the plasma generating region 25 with the pulsed laser beam 33 from the initiation of a burst period, without exerting control. That is, the EUV light generating system 11b may repetitively irradiate the targets 27 which are continuously supplied with the pulsed laser beam 33 without exerting control to adjust the focusing position of the pulsed laser beam 33. Irradiation of the targets 27 with the pulsed laser beam 33 may be continued until the focusing position of the pulsed laser beam 33 gradually shifts away from the targets 27 and the EUV sensors 551 and 552 can no longer detect EUV energy.

2) The EUV light generation controller 5b may calculate the amount of shift of the focusing position from the initiation of the burst periods until EUV energy can no longer be detected, based on the values of EUV energy which are detected by the focusing position detecting unit 55. Further, the EUV light generation controller 5b may employ the calculated amount of shift to derive a first control pattern to be employed during a first period G1 from the beginning of the burst period until EUV energy can no longer be detected.

3) Next, as illustrated in C of FIG. 12, irradiation of the targets 27 with the pulsed laser beam 33 may be repeated while executing feedforward control employing the first control pattern during the first period G1.

4) Thereafter, with respect to the burst period following the first period G1, irradiation of the targets 27 with the pulsed laser beam 33 may be repeated again without exerting control. Irradiation of the targets 27 with the pulsed laser beam 33 may be continued until the focusing position of the pulsed laser beam gradually shifts away from the targets 27 which are supplied to the plasma generating region 25 and the EUV sensors can no longer detect EUV energy.

5) With respect to the burst period following the first period G1, the amount of shift of the focusing position may be calculated based on the values of EUV energy which are detected until EUV energy can no longer be detected. The calculated amount of shift may be employed to derive a second control pattern to be employed during a second period G2 from the end of the first period G1 until EUV energy can no longer be detected.

6) Next, as illustrated in D of FIG. 12, irradiation of the targets 27 with the pulsed laser beam 33 may be repeated while executing feedforward control employing the first control pattern and the second control pattern during the first period G1 and the second period G2.

7) Thereafter, with respect to the burst period following the second period G2, irradiation of the targets 27 with the pulsed laser beam 33 may be repeated again without exerting control. Repetitive irradiation may be continued until the focusing position of the pulsed laser beam shifts away from the targets 27 and the EUV sensors can no longer detect EUV energy.

8) With respect to the burst period following the second period G2, the amount of shift of the focusing position may be calculated based on the values of EUV energy which are detected until EUV energy can no longer be detected. The calculated amount of shift may be employed to derive a third control pattern to be employed during a third period G3 from the end of the second period G2 until EUV energy can no longer be detected.

By employing such a technique, a control pattern for executing feedforward control throughout the entirety of the burst period as illustrated in E of FIG. 12 may be obtained.

6.3 Functions and Effects of the First Modification of the Second Embodiment

A control pattern may be generated for the entirety of a burst period in the manner descried above, even in a case that the focusing position of the pulsed laser beam 33 shifts greatly during a burst period and the EUV sensors cannot detect EUV energy.

7. Second Modification of the Second Embodiment 7.1 Configuration of Focusing Position Detecting Unit in the Second Modification of the Second Embodiment FIG. 13 may be a diagram that illustrates the configuration of the second modification of the second embodiment. The second modification of the second embodiment may be equipped with a focusing position detecting unit 55b having the configuration described below, instead of the focusing position detecting unit 55 of the second embodiment. The other configurations of the second modification may be the same as those of the second embodiment which have been described already.

The focusing position detecting unit 55b provided in the chamber 2 may be an imaging device that captures images of plasma light emission caused by the target 27 being irradiated with the pulsed laser beam and turning into plasma. The imaging wavelengths of the imaging device may include wavelengths of visible light.

A plurality of the imaging devices may be provided so as to capture images of plasma light emission from different positions. For example, the imaging devices may include two imaging units, which are a first imaging unit 553 and a second imaging unit 554. The first imaging unit 553 and the second imaging unit 554 may be arranged such that the two imaging directions form a 90 degree angle when capturing images of plasma light emission.

7.2 Operation of the Second Modification of the Second Embodiment

The first and second imaging units 553 and 554 may transmit images which are obtained by capturing images of plasma light emission, which is repeated during a burst period, to the EUV light generation controller 5b.

The EUV light generation controller 5b may calculate the position of plasma light emission from the images of plasma light emission which are captured by the first and second imaging units 553 and 554, to obtain changes in the positions of plasma light emission which are continuously generated during the burst period.

The EUV light generation controller 5b may calculate the amount of shift of the focusing position of the pulsed laser beam 33 with respect to the plasma generating region 25, from the position of plasma light emission obtained from the images and a position within the plasma generating region 25 which is set in advance.

The operations thereafter may be the same as those of the second embodiment that calculates the amount of shift of the focusing position employing the EUV sensors 551 and 552 described previously.

8. Third Embodiment 8.1 Configuration of the Third Embodiment

The configurations of an EUV light generating system 11c of a third embodiment other than an EUV light generation controller and an actuator controller may be the same as those of the second embodiment. Here, the third embodiment will be described with reference to FIG. 9, which was employed in the description of the second embodiment.

An actuator controller 65c may control each of the actuators by feedback control with respect to output of EUV light toward the tail ends of burst periods, following the output of EUV light at the beginnings of the burst periods, for which feedforward control is executed. The control may control each of the actuators 345, 346, and 225 by feedback control to correct shifts of the focusing position which have been detected by the focusing position detecting unit 55 during the burst periods. The first and second reflective mirrors 341 and 343 as well as the plate 223 may be adjusted by feedback control exerted by the actuator controller 65c so as to compensate for shifts of the focusing position of the pulsed laser beam 33.

In the following description, feedforward control will be abbreviated and also referred to as FF control. In addition, feedback control will be abbreviated and also referred to as FB control.

8.2 Operation of the Third Embodiment

1) The actuator controller 65c may control the first and second actuators 345 and 346 as well as the actuator 225 by FF control, employing a control pattern which is stored in a memory unit 52, prior to entering a first burst period. Each of the reflective surfaces of the first and second reflective mirrors 341 and 343 as well as the position of the plate 223 may be adjusted to predetermined states according to the control pattern, by the FF control.

2) Thereafter, when the burst period is started, the target 27 which is supplied to the plasma generating region 25 may be irradiated with the pulsed laser beam 33 which is output by the laser apparatus 3 and passes through and is focused by the laser beam focusing system 70a. Initial EUV light may be output by the target 27 turning into plasma by being irradiated with the pulsed laser beam 33.

EUV light which is output while suppressing shifts of the focusing position by FF control may only be the initial EUV light. Alternatively, as illustrated in A through E of FIG. 14, the EUV light which is output under FF control may be several outputs of EUV light that include the output of the initial EUV light.

3) EUV light at the trailing side of the burst periods that follows the output of EUV light under FF control toward the leading ends may be output under FB control that suppresses shifts of the focusing position, as illustrated in A through E of FIG. 14.

4) EUV light toward the leading ends of burst periods may be output under FF control and EUV light toward the trailing ends of burst periods may be output under FB control in each of three burst periods with intervening rest periods, as illustrated in A through E of FIG. 14.

5) As a result, the EUV energy during each of the burst periods will become substantially constant by the combination of FF control and FB control, as illustrated in FIG. 14A. In addition, as illustrated in B of FIG. 14, the amount of positional shift in the Y direction between the targets 27 which are supplied to the plasma generating region 25 and the focusing position of the pulsed laser beam 33 will constantly be within a predetermined range.

Various aspects related to the above functions will be described below.

The control pattern for FF control may be determined by experimentation in advance. Alternatively, the control pattern may be derived by an EUV light generation controller 5c in the third embodiment in the same manner as in the second embodiment.

The actuator controller 65c may prepare for FF control with respect to output of EUV light at the beginning of a subsequent burst period at any time during a rest period after completion of a burst period. That is, the first and second reflective mirrors 341 and 343 as well as the plate 223 may be adjusted to inclinations and a position which is determined for output of EUV light at the beginning of the subsequent burst period at any time during the rest period.

Note that when FF control and FB control are combined to repeat output of EUV light during burst periods, the amounts of control of the control pattern for FF control may include items of data such as those indicated below.

a. Amounts of control for each actuator corresponding to output of EUV light at the beginning of a specific burst period.

b. Amounts of control for each actuator corresponding to output of EUV light at the beginning of a specific burst period and for several outputs of EUV light thereafter.

c. Amount of control for each actuator corresponding to output of EUV light at the beginnings of each burst period from the initiation of a burst operation.

d. Amounts of control for each actuator corresponding to output of EUV light at the beginnings of each burst period from the initiation of a burst operation and for several outputs of EUV light thereafter.

e. Amounts of control for each actuator corresponding to elapsed time from the initiation of a burst operation.

The above description is not intended to be limiting, but to be exemplary. Accordingly, it would be clear to those skilled in the art that various changes and modifications may be made to the embodiments of the present disclosure without departing from the scopes of the appended claims.

The terms which are employed in the present specification and the appended claims are to be interpreted as "not limiting". For example, the terms "include" and "including" are to be interpreted to mean "including the described elements but not limited thereto". The term "have" is to be interpreted to mean "having the described elements but not limited thereto". Further, the indefinite articles "a" and "an", as well as the word "one" in the present specification as well as the appended claims are to be interpreted to mean "at least one" or "one or more".

What is claimed is:

1. An extreme ultraviolet light generating system that repetitively outputs extreme ultraviolet light which is generated by a target turning into plasma by being irradiated with a pulsed laser beam, comprising:
a chamber;
a target supply unit configured to sequentially supply the target into a plasma generating region which is set within the chamber;
a laser apparatus configured to output a pulsed laser beam;
a laser beam focusing system configured to focus the pulsed laser beam which is output from the laser apparatus;
an actuator connected to the laser beam focusing system, configured to adjust the focusing position of the pulsed laser beam;
an extreme ultraviolet light generation controller configured to control the extreme ultraviolet light generating system to output extreme ultraviolet light based on a burst pattern; and
an actuator controller configured to control the actuator by feedforward control to compensate for a shift of the focusing position of the pulsed laser beam with respect to the target which is supplied to the plasma generating region that occurs during output of extreme ultraviolet light based on the burst pattern.

2. An extreme ultraviolet light generating system as defined in claim 1, wherein:
the actuator controller comprises a memory unit configured to store a control pattern for compensating for the shift of the focusing position, correlated to the burst pattern; and
the actuator controller controls the actuator by feedforward control to compensate for the shift of the focusing position employing the control pattern stored in the memory unit, when the extreme ultraviolet light generation controller outputs extreme ultraviolet light based on the burst pattern.

3. An extreme ultraviolet light generating system as defined in claim 1, further comprising:
a focusing position detecting unit configured to detect the shift of the focusing position and to output the detected shift of the focusing position to the extreme ultraviolet light generation controller; and wherein:
the extreme ultraviolet light generation controller derives the control pattern based on the output of the focusing position detecting unit.

4. An extreme ultraviolet light generating system as defined in claim 3, wherein:
the focusing position detecting unit detects the intensity of energy of extreme ultraviolet light, and comprises at least two sensors provided at positions which are different from each other.

5. An extreme ultraviolet light generating system as defined in claim 3, wherein:
the focusing position detecting unit comprises at least two imaging devices provided at positions which are different from each other.

6. An extreme ultraviolet light generating system as defined in claim 1, wherein:
the actuator controller executes the feedforward control only during output of extreme ultraviolet light toward the beginning of a burst period, which includes output of extreme ultraviolet light at the beginning of the burst period.

7. An extreme ultraviolet light generating system as defined in claim 1, wherein:
the actuator controller executes the feedforward control only during output of extreme ultraviolet light at the beginning of a burst period.

8. An extreme ultraviolet light generating system as defined in claim 3, wherein:
the actuator controller is configured to control, by feedback control, the actuator with respect to output of extreme ultraviolet light toward the trailing end of a burst period that follows output of extreme ultraviolet light toward the leading end of the burst period, during which the feedforward control is executed, based on a shift of the focusing position which has already been detected during the burst period based on output from the focusing position detecting unit.

9. An extreme ultraviolet light generating system as defined in claim 1, wherein:
the laser beam focusing system comprises:
a laser beam propagating direction controller that includes a reflective mirror that regulates the propagating direction of the pulsed laser beam; and
a laser beam focusing unit that includes a reflective mirror for focusing the pulsed laser beam; and wherein:
the laser beam propagating direction controller is provided at the upstream side of the laser beam focusing unit.

10. An extreme ultraviolet light generating system as defined in claim 9, wherein:
the actuator comprises:
a mirror actuator which is connected to the laser beam propagating direction controller; and
a unit actuator which is connected to the laser beam focusing unit; and wherein:
the response speed of the mirror actuator is faster than the response speed of the unit actuator.

11. An extreme ultraviolet light generating system as defined in claim 2, wherein:
the memory unit is configured to store an amount of control of the actuator in the control pattern and the number of repetitive outputs of extreme ultraviolet light from initiation of a burst operation in the burst pattern, correlated to each other.

12. An extreme ultraviolet light generating system as defined in claim 2, wherein:
the memory unit is configured to store an amount of control of the actuator in the control pattern and the number of burst periods from initiation of a burst operation in the burst pattern, correlated to each other.

13. An extreme ultraviolet light generating system as defined in claim 2, wherein:
the memory unit is configured to store an amount of control of the actuator in the control pattern, the number of burst periods from initiation of a burst operation in the burst pattern, and the number of repetitive outputs of extreme ultraviolet light from initiation of a burst operation, correlated to each other.

14. An extreme ultraviolet light generating system as defined in claim 2, wherein:
the memory unit is configured to store an amount of control of the actuator in the control pattern and elapsed time from initiation of a burst operation in the burst pattern, correlated to each other.

15. An extreme ultraviolet light generating system as defined in claim 2, further comprising:
a focusing position detecting unit configured to detect the shift of the focusing position and to output the detected shift of the focusing position to the extreme ultraviolet light generation controller; and wherein:
the extreme ultraviolet light generation controller derives the control pattern based on the output of the focusing position detecting unit.

16. An extreme ultraviolet light generating system as defined in claim 2, wherein:
the actuator controller executes the feedforward control only during output of extreme ultraviolet light toward the beginning of a burst period, which includes output of extreme ultraviolet light at the beginning of the burst period.

17. An extreme ultraviolet light generating system as defined in claim 2, wherein:
the actuator controller executes the feedforward control only during output of extreme ultraviolet light at the beginning of a burst period.

18. An extreme ultraviolet light generating system as defined in claim 2, wherein:
the actuator controller is configured to control, by feedback control, the actuator with respect to output of extreme ultraviolet light toward the trailing end of a burst period that follows output of extreme ultraviolet light toward the leading end of the burst period, during which the feedforward control is executed, based on a shift of the focusing position which has already been detected during the burst period based on output from the focusing position detecting unit.

19. An extreme ultraviolet light generating system as defined in claim 2, wherein:
the laser beam focusing system comprises:
a laser beam propagating direction controller that includes a reflective mirror that regulates the propagating direction of the pulsed laser beam; and
a laser beam focusing unit that includes a reflective mirror for focusing the pulsed laser beam; and wherein:
the laser beam propagating direction controller is provided at the upstream side of the laser beam focusing unit.

20. An extreme ultraviolet light generating system as defined in claim 19, wherein:
the actuator comprises:
a mirror actuator which is connected to the laser beam propagating direction controller; and
a unit actuator which is connected to the laser beam focusing unit; and wherein:
the response speed of the mirror actuator is faster than the response speed of the unit actuator.

* * * * *